(12) United States Patent
Watanabe et al.

(10) Patent No.: US 8,704,924 B2
(45) Date of Patent: Apr. 22, 2014

(54) SOLID-STATE IMAGING DEVICE WITH A PHOTOELECTRIC CONVERSION ELEMENT, AND METHOD THEREOF

(75) Inventors: Taiichiro Watanabe, Kanagawa (JP); Keiji Mabuchi, Kanagawa (JP); Tetsuji Yamaguchi, Kanagawa (JP); Isao Hirota, Kanagawa (JP); Kouichi Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 372 days.

(21) Appl. No.: 13/029,338

(22) Filed: Feb. 17, 2011

(65) Prior Publication Data

US 2011/0216212 A1      Sep. 8, 2011

(30) Foreign Application Priority Data

Mar. 5, 2010   (JP) ................. 2010-049233

(51) Int. Cl.
*H04N 3/14*      (2006.01)
*H04N 5/335*    (2011.01)
*H01L 27/14*    (2006.01)
*H01L 31/0232*  (2006.01)

(52) U.S. Cl.
USPC ........... 348/301; 348/300; 348/302; 348/294; 257/431; 257/432

(58) Field of Classification Search
USPC ............. 348/294, 300–302; 257/431–466
See application file for complete search history.

(56) References Cited

U.S. PATENT DOCUMENTS

| | | | | |
|---|---|---|---|---|
| 4,654,536 A | * | 3/1987 | Saito et al. | 250/208.1 |
| 6,323,490 B1 | * | 11/2001 | Ikeda et al. | 250/370.09 |
| 6,507,026 B2 | * | 1/2003 | Ikeda et al. | 250/370.09 |
| 8,030,720 B2 | * | 10/2011 | Mabuchi | 257/431 |
| 8,223,233 B2 | * | 7/2012 | Ota | 348/294 |
| 2003/0215058 A1 | * | 11/2003 | Kinno et al. | 378/98.8 |
| 2006/0092299 A1 | * | 5/2006 | Suzuki | 348/294 |
| 2006/0125038 A1 | * | 6/2006 | Mabuchi | 257/447 |
| 2007/0279661 A1 | * | 12/2007 | Misawa | 358/1.9 |
| 2008/0211954 A1 | * | 9/2008 | Ota | 348/311 |
| 2009/0251556 A1 | * | 10/2009 | Mabuchi | 348/222.1 |
| 2010/0002113 A1 | * | 1/2010 | Ota | 348/297 |
| 2011/0149104 A1 | * | 6/2011 | Mabuchi | 348/222.1 |

FOREIGN PATENT DOCUMENTS

| | | |
|---|---|---|
| JP | 61-255063 | 11/1986 |
| JP | 07-107389 | 4/1995 |
| JP | 09-275201 | 10/1997 |
| JP | 2005-268476 | 9/2005 |

(Continued)

OTHER PUBLICATIONS

Japanese Office Action issued in connection with related Japanese Patent Application No. 2010-049233 dated Jan. 21, 2014.

*Primary Examiner* — Chia-Wei A Chen
(74) *Attorney, Agent, or Firm* — Dentons US LLP

(57) ABSTRACT

A solid-state imaging device includes a substrate, a photoelectric conversion element provided on the light incidence side of the substrate and including a photoelectric conversion film sandwiched between a first electrode provided separately for each of pixels, and a second electrode provided opposite the first electrode, the photoelectric conversion film being made of an organic material or an inorganic material and generating a signal charge according to the quantity of incident light, an amplifier transistor having an amplifier gate electrode connected to the first electrode, and a voltage control circuit that is connected to the second electrode, and supplies a desired voltage to the second electrode.

15 Claims, 12 Drawing Sheets

(56) References Cited

FOREIGN PATENT DOCUMENTS

| JP | 2008-228265 | 9/2008 |
| JP | 2008-270298 | 11/2008 |
| JP | 2009-054794 | 3/2009 |

* cited by examiner

SOLID-STATE IMAGING DEVICE WITH A PHOTOELECTRIC CONVERSION ELEMENT, AND METHOD THEREOF

BACKGROUND OF THE INVENTION

1. Field of the Invention

The present invention relates to a solid-state imaging device including, on top of a substrate, a photoelectric conversion element formed by sandwiching a photoelectric conversion film made of an organic material or an inorganic material by a pair of electrodes. Further, the present invention relates to a method of fabricating the solid-state imaging device, a method of driving the solid-state imaging device, and an electronic apparatus that uses the solid-state imaging device.

2. Description of the Related Art

In the related art, in a solid-state imaging device formed by laminating a photoelectric conversion element made of an organic photoelectric conversion film on top of a semiconductor substrate, the organic photoelectric conversion film is sandwiched by an upper electrode and a lower electrode that are used to apply voltage to the organic photoelectric conversion film. Signal charge generated by the organic photoelectric conversion film is read out by connecting one of the upper electrode and the lower electrode to transistors formed in the substrate (Japanese Unexamined Patent Application Publication No. 2005-268476).

FIGS. 14 and 15 are each a schematic cross-sectional diagram of a solid-state imaging device according to the related art. FIG. 14 shows a solid-state imaging device 100 according to the related art formed by three transistors including an amplifier transistor Trc, a reset transistor Trb, and a select transistor Trd. FIG. 15 shows a solid-state imaging device 101 according to the related art formed by four transistors, with a transfer transistor Tra further added to the structure shown in FIG. 14.

As shown in FIGS. 14 and 15, the solid-state imaging devices 100 and 101 according to the related art have the individual transistors formed in a substrate 102, a wiring layer 104 formed on the substrate 102, and a photoelectric conversion element 109 formed on top of the wiring layer 104. The photoelectric conversion element 109 is formed by laminating a lower electrode 106, an organic photoelectric conversion film 107, and an upper electrode 108 in order on the wiring layer 104. The transistors Tra to Trc each include a source/drain region 113 formed by a high concentration impurity region in the near-surface side of the substrate 102, and a gate electrode 111 formed on the surface of the substrate 102 via a gate insulating film 103. In the wiring layer 104, a plurality of layers of wires 110 are formed so as to be laminated via an interlayer insulating film 105. Connections between desired wires, and between the wires 110 and the substrate 102 are each made through a contact 112.

As shown in FIG. 15, in the case of the solid-state imaging device 101 having four transistors including the transfer transistor Tra, the lower electrode 106 is connected to a P-type or N-type high concentration semiconductor region (source/drain region 113) formed in the substrate 102, via the wiring layer 104. In the solid-state imaging device 101 shown in FIG. 15, signal charge generated by the photoelectric conversion element 109 is connected to a photodiode region PD serving as a source region of the transfer transistor Tra, via the lower electrode 106 and the wiring layer 104, and the signal charge is stored in the source region. Thereafter, by the transfer transistor Tra, the signal charge stored in the photodiode region PD is transferred to a floating diffusion FD serving as a drain region, and a pixel signal is outputted via the amplifier transistor Trc. Also, the potential of the floating diffusion FD is reset by the reset transistor Trb.

On the other hand, as shown in FIG. 14, even in the case where no transfer transistor is formed, and the lower electrode 106 is directly connected to the gate electrode 111 of the amplifier transistor Trc, the lower electrode 106 is connected to the high concentration semiconductor region serving as the source region of the reset transistor Trb.

In this way, in each of the solid-state imaging devices 100 and 101 according to the related art, the lower electrode 106 is connected via the contact 112 to the high concentration semiconductor region formed in the substrate 102, for purposes such as storing the signal charge generated in the organic photoelectric conversion film 107, and resetting the potential of the lower electrode 106.

Incidentally, for typical solid-state imaging devices according to the related art having a photoelectric conversion element inside a semiconductor substrate, in order to suppress dark current produced at the interface of the semiconductor substrate, it is common to form a dark current suppression region to reduce dark current.

However, in the case of the solid-state imaging devices 100 and 101 according to the related art having the photoelectric conversion element 109 made of the organic photoelectric conversion film 107 as described above, it is not possible to form a semiconductor region for reducing dark current at the connecting part (region indicated by a broken line "a") of the high concentration semiconductor region and the contact 112. Thus, the connecting part becomes the source of dark current. Accordingly, unlike typical solid-state imaging devices having a photoelectric conversion element made of a photodiode inside a semiconductor substrate, the solid-state imaging devices 100 and 101 according to the related art formed by the photoelectric conversion element 109 made of the organic photoelectric conversion film 107 have a problem in that dark current is accumulated even during charge storage.

While the above example is directed to the case of a photoelectric conversion element formed by sandwiching an organic photoelectric conversion film by upper and lower electrodes, the same problem arises also in the case where a photoelectric conversion element formed by sandwiching an inorganic photoelectric conversion film by upper and lower electrodes is provided on top of the substrate.

SUMMARY OF THE INVENTION

It is desirable to provide a solid-state imaging device which makes it possible to suppress dark current during charge storage, the solid-state imaging device including, on top of a substrate, a photoelectric conversion element formed by sandwiching a photoelectric conversion film made of an organic material or an inorganic material by a pair of electrodes, and also provide a method of fabricating the solid-state imaging device, a method of driving the solid-state imaging device, and an electronic apparatus that uses the solid-state imaging device.

A solid-state imaging device according to an embodiment of the present invention includes a substrate, a photoelectric conversion element formed on the light incidence side of the substrate, an amplifier transistor, and a voltage control circuit.

The photoelectric conversion element includes a photoelectric conversion film sandwiched between a first electrode provided separately for each of pixels, and a second electrode provided opposite the first electrode, the photoelectric conversion film being made of an organic material or an inorganic material and generating a signal charge according to the quantity of incident light. The amplifier transistor has an amplifier gate electrode that is connected to the first electrode. The voltage control circuit is connected to the second electrode, and supplies a desired voltage to the second electrode.

In the solid-state imaging device according to an embodiment of the present invention, the first electrode constituting the photoelectric conversion element is connected to the amplifier gate electrode of the amplifier transistor but is not directly connected to the substrate. Also, the structure of the solid-state imaging device according to an embodiment of the present invention is such that it is unnecessary to store signal charge in the substrate. Therefore, it is unnecessary to establish direct contact with the substrate from the first electrode, and thus dark current can be suppressed. Also, by supplying a desired voltage to the second electrode by the voltage control circuit, at the reset operation, signal charge can be discharged from the second electrode side.

A method of fabricating a solid-state imaging device according to an embodiment of the present invention includes the steps of: forming a plurality of transistors in a substrate; forming a wiring layer on the substrate, the wiring layer having a plurality of wires laminated via an interlayer insulating film; forming a first electrode separately for each of pixels, on an illuminated side of the substrate, the first electrode being electrically connected to an amplifier gate electrode of an amplifier transistor of the plurality of transistors; forming a photoelectric conversion film made of an organic material or an inorganic material, on top of the first electrode; and forming a second electrode electrically connected to a voltage control circuit, on top of the photoelectric conversion film.

By the method of fabricating a solid-state imaging device according to an embodiment of the present invention, the solid-state imaging device described above is completed. Thus, the first electrode constituting the photoelectric conversion element is connected to the amplifier gate electrode of the amplifier transistor but is not directly connected to the substrate. Therefore, it is unnecessary to establish direct contact with the substrate from the first electrode, and thus dark current can be suppressed. Also, by supplying a desired voltage to the second electrode by the voltage control circuit, at the reset operation, signal charge can be discharged from the second electrode side.

In the method of driving a solid-state imaging device according to an embodiment of the present invention, in the above-described solid-state imaging device according to an embodiment of the present invention, during the charge storage operation, a first voltage is supplied to the second electrode from the voltage control circuit. Thus, the signal charge generated in the photoelectric conversion film is moved toward the first electrode, and a pixel signal is outputted by detecting the potential of the first electrode by the amplifier transistor. Also, at the reset operation, a second voltage different from that supplied during charge storage is supplied to the second electrode from the voltage control circuit. Thus, the signal charge stored on the first electrode side is discharged.

In the method of driving a solid-state imaging device according to an embodiment of the present invention, signal charge is moved in opposite directions between during the charge storage operation and at the reset operation. Also, since the first electrode is connected to the amplifier electrode of the amplifier transistor on the side where the signal charge is read out, and the reset operation is performed from the second electrode side, it is unnecessary to directly connect the first electrode and the substrate with each other. Therefore, it is possible to suppress dark current due to direct contact being established with the substrate from the first electrode.

An electronic apparatus according to an embodiment of the present invention includes the above-described solid-state imaging device, an optical lens, and a signal processing circuit. The optical lens collects incident light, and makes the light incident on the solid-state imaging device. The signal processing circuit processes an output signal outputted from the solid-state imaging device.

DESCRIPTION OF THE PREFERRED EMBODIMENTS

Hereinbelow, a solid-state imaging device according to each of embodiments of the present invention, and an example of an electronic apparatus will be described with reference to FIGS. 1 to 13. The embodiments of the present invention will be described in the following order. It should be understood that the present invention is not limited to the following examples.

1. Overall Structure of Solid-state Imaging Device
2. First Embodiment: Front-illuminated Solid-state Imaging Device
   2-1 Structure and Fabrication Method
   2-2 Driving Method
3. Second Embodiment: Front-illuminated Solid-state Imaging Device
4. Third Embodiment: Front-illuminated Solid-state Imaging Device
5. Fourth Embodiment: Back-illuminated Solid-state Imaging Device
6. Fifth Embodiment: Back-illuminated Solid-state Imaging Device
7. Sixth Embodiment: Electronic Apparatus <1. Overall Structure of Solid-state Imaging Device>

First, referring to FIG. 1, a description will be given of the overall structure of a CMOS type solid-state imaging device to which each of the embodiments described below are applied, that is, a CMOS image sensor.

Figure 1:
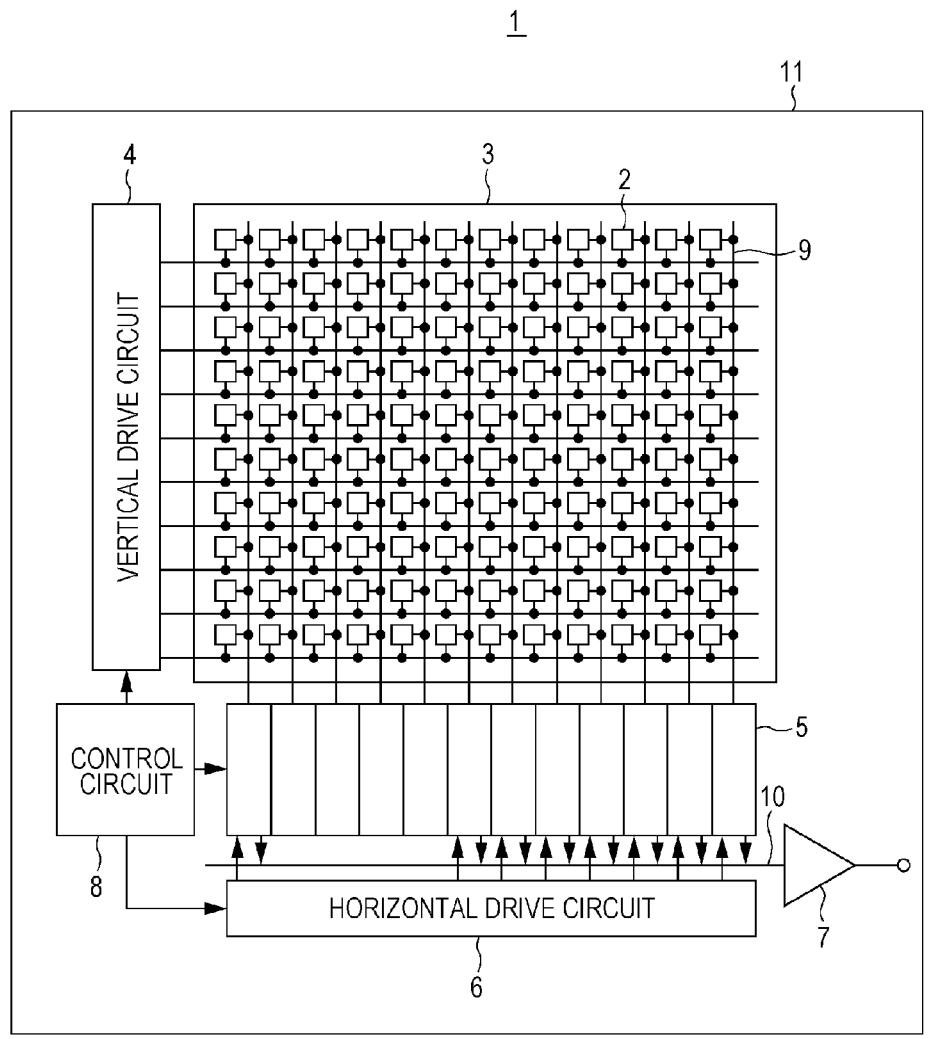
FIG. 1 is a schematic diagram showing the overall structure of a solid-state imaging device according to an embodiment of the present invention.

As shown in FIG. 1, a solid-state imaging device 1 has an imaging region 3 made up of a plurality of pixels 2, a vertical drive circuit 4, column signal processing circuits 5, a horizontal drive circuit 6, an output circuit 7, a control circuit 8, and the like provided on a substrate 11 made of silicon.

Each of the pixels 2 includes a photoelectric conversion element that generates a signal charge according to the quantity of received light, and a plurality of MOS transistors for reading out and transferring the signal charge. The plurality of pixels 2 are arranged regularly in a two-dimensional array on the substrate 11.

The imaging region 3 is made up of the plurality of pixels 2 arranged regularly in a two-dimensional array. The imaging region 3 includes an active pixel region that can actually receive light and store signal charge generated by photoelectric conversion, and a black reference pixel region formed around the active pixel region to output optical block serving as a black level reference.

The control circuit 8 generates clock signals, control signals, and the like which serve as a reference for operation of the vertical drive circuit 4, the column signal processing circuits 5, the horizontal drive circuit 6, and the like, on the basis of vertical synchronization signals, horizontal synchronization signals, and master clocks. Then, the clock signals, the control signals, and the like generated by the control circuit 8 are inputted to the vertical drive circuit 4, the column signal processing circuits 5, the horizontal drive circuit 6, and the like.

The vertical drive circuit 4 is formed by, for example, a shift register, and selects and scans the pixels 2 in the pixel region 3 sequentially in the vertical direction on a row-by-row basis. Then, the vertical drive circuit 4 supplies a pixel signal based on the signal charge generated in the photoelectric conversion element of each of the pixels 2, to each of the column signal processing circuits 5 through a vertical signal line 9.

The column signal processing circuits 5 are arranged for, for example, individual columns of the pixels 2. The column signal processing circuits 5 each perform signal processing, such as noise removal and signal amplification, on signals outputted from a single row of the pixels 2, on a pixel-column by pixel-column basis using signals from the black reference pixel region (which is, although not shown, formed around the active pixel region). A horizontal select switch (not shown) is provided between the output stage of the column signal processing circuits 5 and a horizontal signal line 10.

The horizontal drive circuit 6 is formed by, for example, a shift register. By sequentially outputting horizontal scanning pulses, the horizontal drive circuit 6 selects each of the column signal processing circuits 5 in turn, and causes the individual column signal processing circuits 5 to output pixel signals to the horizontal signal line 10.

The output circuit 7 performs signal processing on the signals sequentially supplied from the individual column signal processing circuits 5 through the horizontal signal line 10, and outputs the processed signals.

The solid-state imaging device according to each of the embodiments described below forms the solid-state imaging device 1 shown in FIG. 1. In particular, the cross-sectional structure of each pixel in the active imaging region is illustrated.

<2. First Embodiment: Front-illuminated Solid-state Imaging Device>

A solid-state imaging device according to a first embodiment of the present invention will be described.

[2-1 Structure and Fabrication Method]

Figure 2:
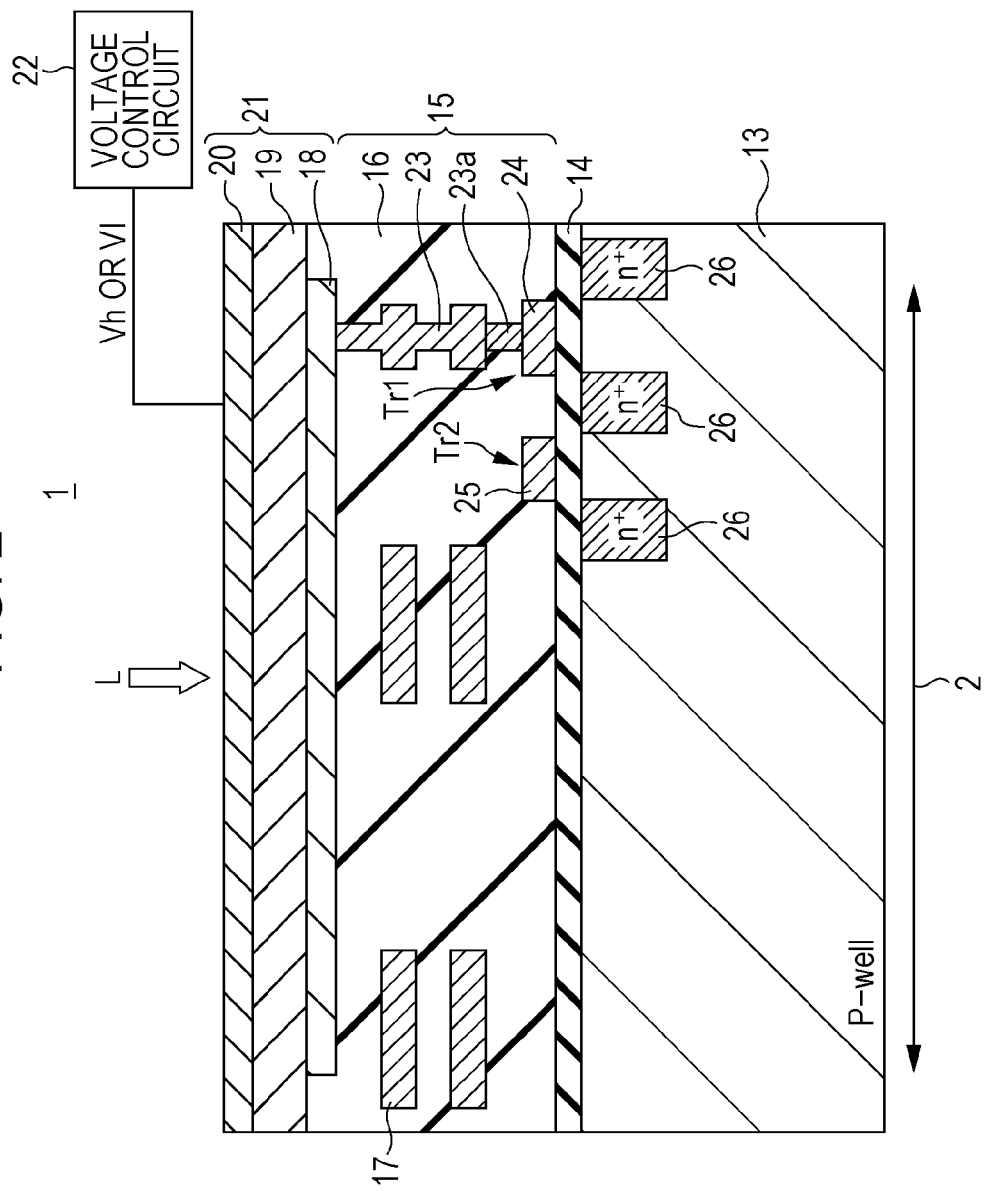
FIG. 2 is a schematic cross-sectional diagram (partly in block diagram) of each of pixels in a solid-state imaging device according to a first embodiment of the present invention.

First, the structure of the solid-state imaging device according to this embodiment, and its fabrication method will be described. FIG. 2 is a schematic cross-sectional diagram (partly in block diagram) of each of the pixels 2 in the solid-state imaging device 1 according to this embodiment.

Each of the pixels 2 in the solid-state imaging device 1 according to this embodiment has a substrate 13, a wiring layer 15, a photoelectric conversion element 21 provided on top of the substrate 13, and an amplifier transistor Tr1, a select transistor Tr2, and a voltage control circuit 22 which are formed in the substrate 13.

The substrate 13 is formed by, for example, a silicon substrate of a first conductivity type (hereinafter, referred to as p-type).

The amplifier transistor Tr1, the select transistor Tr2, and the voltage control circuit 22 are formed in the substrate 13. The amplifier transistor Tr1 includes source/drain regions 26 formed in the near-surface side of the substrate 13, and an amplifier gate electrode 24 formed on the substrate 13 between the source/drain regions 26 via a gate insulating film 14.

The select transistor Tr2 includes the source/drain regions 26 formed in the near-surface side of the substrate 13, and a select gate electrode 25 formed on the substrate 13 between the source/drain regions 26 via the gate insulating film 14. While in FIG. 2 the source/drain regions 26 are shared by the amplifier transistor Tr1 and the select transistor Tr2, the source/drain regions 26 may or may not be shared. When the source/drain regions 26 are shared, pixel area can be reduced.

As shown in FIG. 2, the source/drain regions 26 of the amplifier transistor Tr1 and the select transistor Tr2 are formed by ion-implanting second conductivity type (hereinafter, referred to as n-type) impurities at high concentration into the near-surface side of the substrate 13. The gate insulating film 14 is made of, for example, a silicon oxide film, and formed on the surface of the substrate 13. The amplifier gate electrode 24 and the select gate electrode 25 are formed by depositing polysilicon on the surface of the gate insulating film 14, and patterning the deposited polysilicon into a predetermined shape.

In this way, the amplifier transistor Tr1 and the select transistor Tr2 according to this embodiment are each formed by an n-channel MOS transistor.

The amplifier gate electrode 24 of the amplifier transistor Tr1 is electrically connected to a first electrode 18 described later. A desired select pulse voltage is applied to the select gate electrode 25 of the select transistor Tr2. The drain of the amplifier transistor Tr1 is connected to, for example, a power supply voltage, and the source of the select transistor Tr2 is connected to a signal wire (not shown).

The voltage control circuit 22 is connected to a second electrode 20 described later, and supplies a first voltage Vl and a second voltage Vh to the second electrode 20 at predetermined timing. Although not shown, like the amplifier transistor Tr1 and the select transistor Tr2 described above, the voltage control circuit 22 is formed in the substrate 13, and includes, for example, n-channel MOS transistors.

The wiring layer 15 is provided on the front side of the substrate 13, and includes a plurality of layers of wires 17 (two layers in the drawing) made of aluminum (Al) or copper (Cu) formed via an interlayer insulating film 16 made of $SiO_2$. A connection between desired wires 17 formed in different layers is made via a contact 23 formed in the interlayer insulating film 16, and a connection between a desired wire 17 and a transistor formed in the substrate 13 is made via a contact 23a.

The wiring layer 15 is formed by alternately forming the interlayer insulating film 16 and the wire 17. The contacts 23 and 23a are each formed by forming a contact hole in a predetermined region, and filling the contact hole with a metallic material. For example, tungsten (W) can be used as the metallic material forming the contact 23 between the wire 17 and the wire 17. Also, for example, copper (Cu) or aluminum (Al) can be used as the metallic material forming the contact 23a between the wire 17 and the substrate 13.

The photoelectric conversion element 21 is formed by sandwiching a photoelectric conversion film 19 made of an organic material between the first electrode 18, and the second electrode 20 provided opposite the first electrode 18. The photoelectric conversion element 21 is laminated on the illuminated side of the substrate 13 via the wiring layer 15.

The photoelectric conversion film 19 is made of an organic material, and generates a signal charge according to the quantity of received light. Examples of organic material forming the photoelectric conversion film 19 include pentacene and derivatives thereof (such as TIPS-pentacene), naphthacene and derivatives thereof (such as rubrene and hexapropylnaphthacene), thiophene and derivatives thereof (such as P3HT), fullerene and derivatives thereof (such as PCBM), TCQN, perylene and derivatives thereof, porphyrin and porphyrin derivatives, acridine and derivatives thereof, coumarin and derivatives thereof, quinacridone and derivatives thereof, cyanine and derivatives thereof, squarylium and derivatives thereof, oxazine and derivatives thereof, xanthene triphenylamine and derivatives thereof, benzidine and derivatives thereof, pyrazoline and derivatives thereof, styrylamine and derivatives thereof, hydrazone and derivatives thereof, triphenyl methane and derivatives thereof, carbazole and derivatives thereof, polysilane and derivatives thereof, polyamine and derivatives thereof, oxadiazole and derivatives thereof, triazole and derivatives thereof, triazine and derivatives thereof, quinoxaline and derivatives thereof, phenanthroline and derivatives thereof, aluminum quinoline and derivatives thereof, polyparaphenylene vinylene and derivatives thereof, polyfluorene and derivatives thereof, polyvinyl carbazole and derivatives thereof, polythiol and derivatives thereof, polypyrrole and derivatives thereof, and polythiophene and derivatives thereof. By selecting, as each of the organic materials represented by these, a material having a peak sensitivity in each of the wavelength ranges of red (R), green (G), and blue (B), the photoelectric conversion film 19 constituting each of the pixels 2 of R, G, and B can be formed. Also, the organic materials represented by these may each be used singularly to form the photoelectric conversion film 19, or two or more kinds of the organic materials represented by these may be mixed together or laminated to form the photoelectric conversion film 19.

For example, to form the pixels 2 for performing photoelectric conversion of the green wavelength of light, as the photoelectric conversion film 19, for example, an organic material including rhodamine-based dye, meracyanine-based dye, quinacridone, or the like can be used. To form the pixels 2 for performing photoelectric conversion of the red wavelength of light, as the photoelectric conversion film 19, an organic material including phthalocyanine-based dye can be used. Also, as the photoelectric conversion film 19 for performing photoelectric conversion of the blue wavelength of light, an organic material including coumarin-based dye, tris-8-hydrixyquinoline Al (Alq3), meracyanine-based dye, or the like can be used.

As the photoelectric conversion film 19, an organic material for performing photoelectric conversion of the same color wavelength of light may be used for all the pixels 2, or an organic material for performing photoelectric conversion of a different color wavelength of light may be used for each of the pixels 2.

The first electrode 18 serving as the lower electrode is provided on the wiring layer 15 side of the photoelectric conversion film 19. The first electrode 18 is provided separately for each of the pixels 2. Also, the second electrode 20 serving as the upper electrode is provided on the light incidence side of the photoelectric conversion film 19 which is opposite to the wiring layer 15 side.

Figure 3:
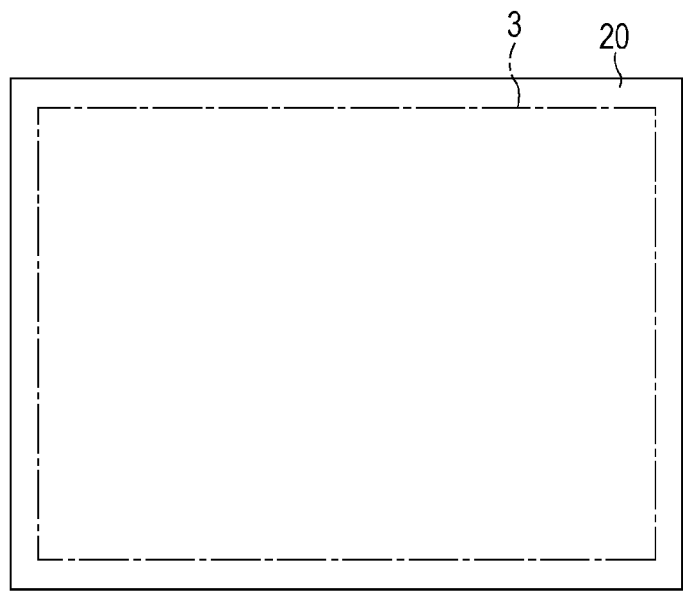
FIG. 3 is a plan diagram of a second electrode with respect to an imaging region, in the solid-state imaging device according to the first embodiment of the present invention.

FIG. 3 is a plan diagram of the second electrode 20 with respect to the imaging region 3. As shown in FIG. 3, in this embodiment, the second electrode 20 is formed in such a size that covers the imaging region 3, and is formed so as to be common across all the pixels 2.

As the material forming each of the first electrode 18 and the second electrode 20, a transparent electrode material can be used. For example, the first electrode 18 and the second electrode 20 may each be formed by a transparent conductive film such as an indium tin oxide (ITO) film, a zinc oxide (ZnO) film, or an indium zinc oxide film.

The photoelectric conversion element 21 is formed by laminating the first electrode 18, the photoelectric conversion film 19, and the second electrode 20 in order on top of the wiring layer 15. The first electrode 18 can be formed by forming an electrode material on top of the entire surface of the wiring layer 15 in the imaging region 3, and then patterning the electrode material so as to be split for each of the individual pixels 2. At this time, since it is necessary for the first electrode 18 to be electrically connected with the amplifier gate electrode 24 via the wiring layer 15, the first electrode 18 formed separately for each of the individual pixels 2 is formed so as to connect to the contact 23 connecting to the amplifier gate electrode 24.

The photoelectric conversion film 19 can be formed in a single layer, or in a plurality of layers by depositing an organic material on top of the entire surface of the wiring layer 15 including the first electrode 18, by using a CVD method, a stamping method, a vapor deposition method, a coating method, a spin coating method, an ink-jet method, an immersion method, or the like. The thickness of the photoelectric conversion film 19 is, for example, several nm to several μm.

The second electrode 20 can be formed by forming an electrode material on top of the entire surface of the photoelectric conversion film 19. Also, the second electrode 20 is connected to the voltage control circuit 22. As described above, like the amplifier transistor Tr1 and the select transistor Tr2, the voltage control circuit 22 is formed in a predetermined region of the substrate 13. Thus, a connection between the second electrode 20 and the voltage control circuit 22 is made via the wire 17 formed in the wiring layer 15, and the contact 23.

In this embodiment, the second electrode 20 is formed common to all of the pixels 2. Hence, it is unnecessary to perform patterning within the imaging region 3, and machining is easy. Also, since the second electrode 20 is formed common to all of the pixels 2, it is unnecessary to form the voltage control circuit 22 for each of the pixels 2. Hence, the scale of the voltage control circuit 22 can be reduced, which makes it possible to increase the area of the imaging region 3 or increase the area of the surrounding circuit. Also, there are only a few wires for connecting the voltage control circuit 22 and the second electrode 20 to each other, thus allowing for easy wiring arrangement. Furthermore, as compared with the case where the second electrode 20 is formed separately for each of the pixels 2, there is no slit between electrodes, thereby making it possible to increase the aperture ratio of the pixels 2.

After the first electrode 18, the photoelectric conversion film 19, and the second electrode 20 are laminated in order to form the photoelectric conversion element 21, a flattening film, an on-chip micro lens, and the like (not shown) are formed on top of the second electrode 20, thereby completing the solid-state imaging device 1 according to this embodiment. It should be noted that the formation of the flattening film, the on-chip micro lens, and the like can be performed in the same way as in typical solid-state imaging devices. In addition, in the solid-state imaging device 1 according to this embodiment, the photoelectric conversion film 19 is made of an organic material that generates a signal charge according to a specific wavelength of light, and hence no color filter is formed.

[2-2 Driving Method]

Next, a method of driving the solid-state imaging device 1 according to this embodiment will be described. As shown in FIG. 2, the solid-state imaging device 1 according to this embodiment is a front-illuminated solid-state imaging device which is illuminated with light L from the front side of the substrate 13 where the photoelectric conversion element 21 is formed, and uses an electron as signal charge, out of the electron-hole pair.

First, referring to FIG. 4, the solid-state imaging device 1 according to this embodiment during the charge storage operation and at the reset operation will be described. The expression "during the charge storage operation" refers to the time from when storage is started by illuminating the photoelectric conversion element 21 with the light L to generate signal charge, to when the storage is finished. Also, the expression "at the reset operation" refers to the timing at which the signal charge stored in the photoelectric conversion element 21 is discharged to reset the potential of the photoelectric conversion element 21 to the potential prior to the charge storage.

Figure 4:
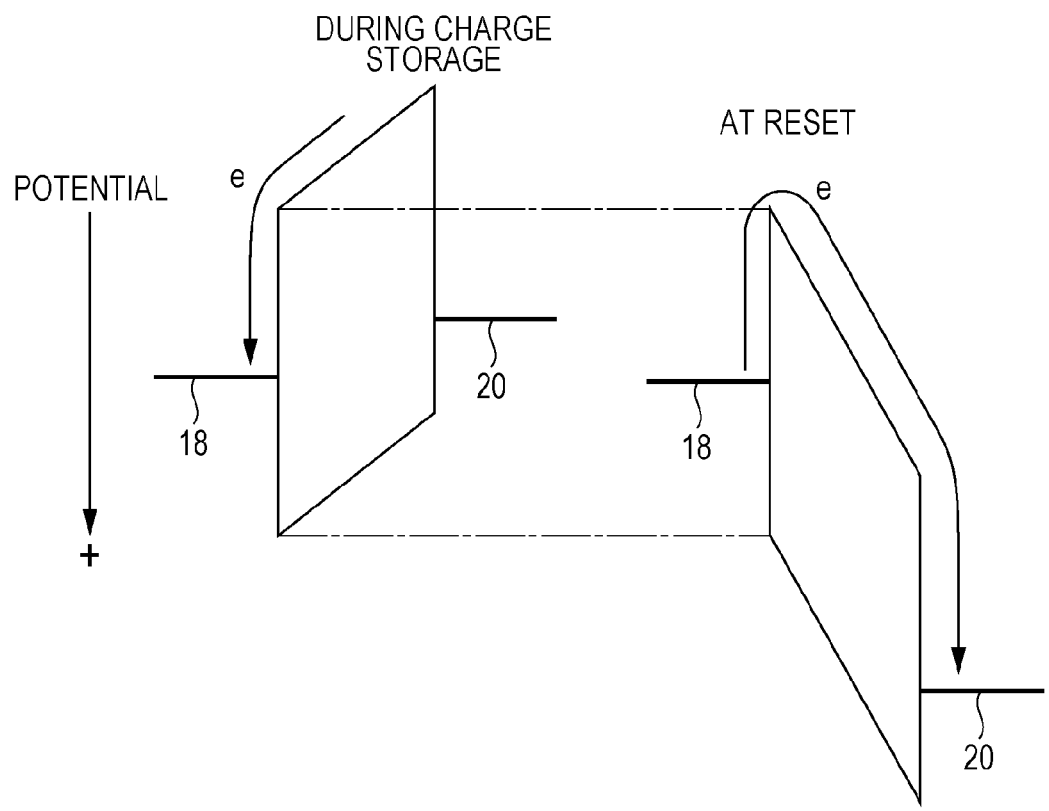
FIG. 4 is a change chart of the energy band of a photoelectric conversion film during the charge storage operation and at the reset operation.

FIG. 4 is a change chart of the energy band of the photoelectric conversion film 19 during the charge storage operation and at the reset operation. In the solid-state imaging device 1 according to this embodiment, although the potential of the first electrode 18 is not manipulated, as shown in FIG. 4, as the voltage of the second electrode 20 is manipulated, the potential of the first electrode 18 changes so as to follow the potential of the second electrode 20 via the photoelectric conversion film 19.

Also, during charge storage, the second electrode 20 is applied with the first voltage Vl lower than the voltage V of the first electrode 18, and at reset, the second electrode 20 is applied with the second voltage Vh (reset pulse) higher than the voltage V of the first electrode 18.

During the charge storage operation, upon incidence of the light L on the pixels 2, the light L undergoes photoelectric conversion in the photoelectric conversion film 19 in accordance with the wavelength and quantity of the light, forming an electron-hole pair in the photoelectric conversion film 19. Of the electron/hole pair generated by this photoelectric conversion, the electron "e" serving as signal charge is drawn to the first electrode 18 applied with the voltage V higher than the first voltage Vl applied to the second electrode 20, and stored on the first electrode 18 side.

At this time, the hole is drawn to the second electrode 20 applied with the first voltage Vl, which is a voltage lower than that of the first electrode 18, and discharged through a predetermined wire (not shown).

As a result, the signal charge generated in the photoelectric conversion film 19 during charge storage is stored on the first electrode 18 side. Thus, the potential of the first electrode 18 fluctuates, and the voltage applied to the amplifier electrode 24 of the amplifier transistor Tr1 electrically connected to the first electrode 18 changes. Then, a pixel signal is detected by amplifying the potential of the first electrode 18 by the amplifier transistor Tr1. It should be noted that the pixel signal detected by the amplifier transistor Tr1 is selectively outputted to the signal line by the select transistor Tr2.

Then, during the charge storage operation, by setting the band structure of the photoelectric conversion element 21 appropriately, a barrier can be formed between the second electrode 20 side and the photoelectric conversion film 19. This can prevent movement of dark current that becomes the cause of noise produced in the voltage control circuit 22 or the like from the second electrode 20 side to the first electrode 18 side. As a result, flow of noise from the second electrode 20 side to the first electrode 18 side can be prevented. Therefore, during the charge storage operation, noise produced on the voltage control circuit 22 side is not readily transferred to the first electrode 18 side.

Next, at the reset operation, as the second voltage Vh higher than the voltage V of the first electrode 18 is applied to the second electrode 20, the band structure changes as shown in FIG. 4.

Thus, the electron "e" as signal charge stored on the first electrode 18 side moves to the second electrode 20, and is discharged to the voltage control circuit 22. In this case, by appropriately setting the band structure of the photoelectric conversion element 21 at reset, the signal charge stored in the portion from the first electrode 18 to the amplifier electrode 24 can be all discharged to the voltage control circuit 22 side.

Thus, the potential of the electrically connected portion from the second electrode 20 to the amplifier electrode 24 of the amplifier transistor Tr1 (that is, the region in which the signal storage has been stored) is reset.

In this way, according to this embodiment, by causing the relative magnitude of voltages applied to the first electrode 18 and the second electrode 20 to vary between during the charge storage operation and at the reset operation, the direction of flow of the signal charge generated by the photoelectric conversion film 19 can be varied.

Also, in this embodiment, the first electrode 18 in which signal charge is stored is connected to only the amplifier gate electrode 24 of the amplifier transistor Tr1, and the first electrode 18 is not connected to the substrate 13. The reset operation is performed from the side of the second electrode 20 not connected to the amplifier gate electrode 24.

That is, in the solid-state imaging device 1 according to this embodiment, unlike the solid-state imaging device according to the related art, the location where charge generated in the photoelectric conversion film is stored is not the high concentration impurity region in the substrate. Further, the first electrode 18 is not connected to the high concentration semiconductor region formed in the substrate 13 in order to store signal charge generated in the photoelectric conversion film 19 or reset the potential of the first electrode 18. This makes it possible to prevent the influence of dark current due to the high concentration impurity region during the storage time of signal charge.

Also, by setting the band structure of the first electrode 18 and the second electrode 20 during the charge storage operation and at the reset operation so as to become as shown in FIG. 4, during charge storage, it is possible to prevent dark current components from flowing from the second electrode 20 side to the first electrode 18 side.

[Correlated Double Sampling Method]

Incidentally, for solid-state imaging devices, it is common to reduce noise by using correlated double sampling with respect to the signal output (P-phase output) detected immediately after the photoelectric conversion element is reset, and the signal output (D-phase output) detected after charge storage.

Next, a description will be given of a method of driving the solid-state imaging device 1 according to this embodiment in the case where correlated double sampling is used.

First, the second voltage Vh (reset pulse) higher than the voltage V being applied to the first electrode 18 is applied to the second electrode 20 by the voltage control circuit 22. This resets the potential of the electrically connected portion from the second electrode 20 to the amplifier gate electrode 24.

Next, the first voltage Vl lower than the voltage V being applied to the first electrode 18 is applied to the second electrode 20 by the voltage control circuit 22, and generation and storage of signal charge in the photoelectric conversion element are started. The signal charge generated within a predetermined storage time is drawn to the first electrode 18 side, and stored. Then, the potential of the first electrode 18 fluctuates, and the potential of the amplifier electrode 24 electrically connected to the first electrode 18 also fluctuates. The quantity of charge is detected by the potential fluctuation of the amplifier gate electrode 24, and a pixel signal is selectively outputted to the signal wire by the select transistor Tr2.

Thus, the D-phase output is obtained.

Next, the second voltage Vh (reset pulse) higher than the voltage V being applied to the first electrode 18 is applied to the second electrode 20. This resets the potential of the electrically connected portion from the first electrode 18 to the amplifier gate electrode 24, to the potential prior to charge storage. Then, the quantity of charge (quantity of dark current) at reset is detected by the potential fluctuation of the amplifier gate electrode 24 of the amplifier transistor Tr1 immediately after the reset, and a reset signal is selectively outputted to the signal wire by the select transistor Tr2. Thus, the P-phase output is obtained.

By performing correlated double sampling with respect to the D-phase output obtained as described above, and the P-phase output obtained after the subsequent reset, a noise signal is detected. As a result, noise can be reduced.

In the case of the solid-state imaging device 1 according to this embodiment, if the P-phase output is obtained first, the storage time for signal charge is necessary, and thus it takes some time until the D-phase output is obtained. The resulting time difference between the P-phase output and the D-phase output may make accurate noise detection difficult. For this reason, as described above, when performing correlated double sampling, it is desired to obtain the P-phase output after the D-phase output is obtained, and sample the two outputs.

[Driving by Global Exposure]

In the solid-state imaging device 1 according to this embodiment, global exposure is possible by use of a mechanical shutter. This global exposure will be described below with reference to FIGS. 5 and 6.

Figure 5:
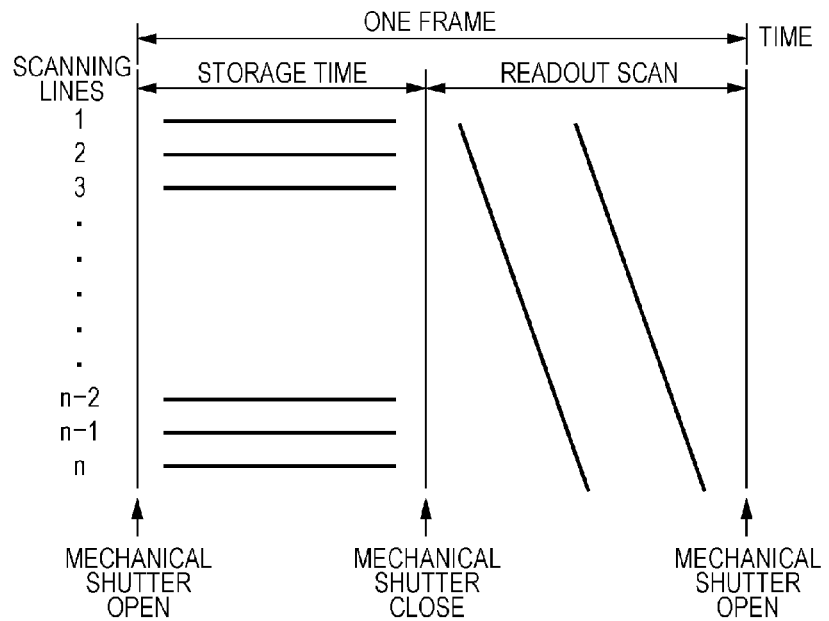
FIG. 5 is a diagram schematically showing the storage time of signal charge, and a readout scan during one frame period.
Figure 6:
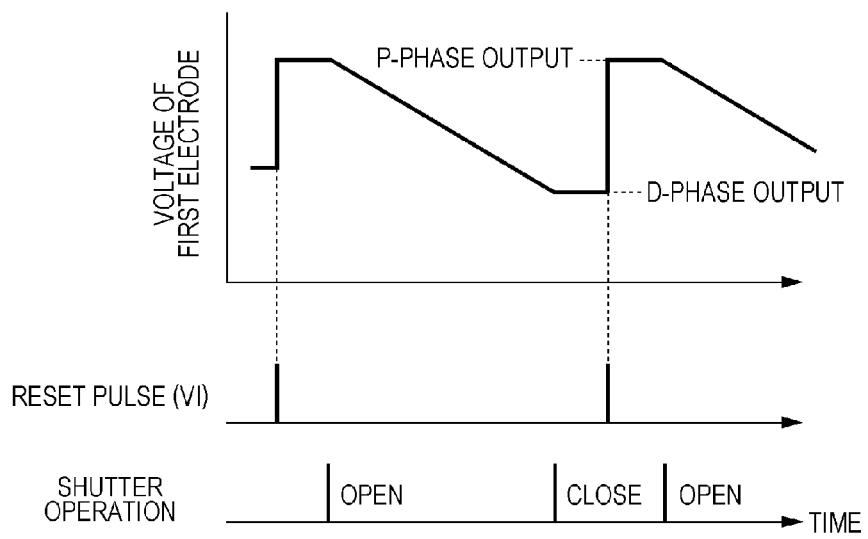
FIG. 6 is a diagram showing a timing chart of a reset pulse supplied to the second electrode, and the shutter operation of a mechanical shutter, and the corresponding voltage variation of a first electrode.

FIG. 5 is a diagram schematically showing the storage time of signal charge, and a readout scan during one frame period. FIG. 6 is a diagram showing a timing chart of a reset pulse (second voltage Vh) supplied to the second electrode 20, and the shutter operation of the mechanical shutter, and the corresponding voltage variation of the first electrode 18.

First, a reset pulse (which in this example is the second voltage Vh) is applied to the second electrode 20 by the voltage control circuit 22. The first electrode 18 is thus reset. Next, the mechanical shutter is opened to start exposure, and after a predetermined storage time, the mechanical shutter is closed to end the exposure. Through the exposure, signal charge is generated by photoelectric conversion in the photoelectric conversion film 19 of each of the pixels 2, and the signal charge is drawn to the first electrode 18 side. Thus, the voltage of the first electrode 18 drops. In this way, storage of signal charge is performed simultaneously in all the pixels 2.

Next, after closing the mechanical shutter, the scanning lines are sequentially scanned to output a pixel signal to the signal wire for each of the pixels 2. Thus, the D-phase output is obtained for each of the pixels 2.

Next, the second voltage Vh (reset pulse) is applied to the second electrode 20. Thus, the potential of the first electrode 18 is reset, and this reset potential is read out for each of the pixels 2, thereby outputting a reset signal for each of the pixels 2 to the signal wire. Thus, the P-phase output is obtained for each of the pixels 2.

Then, by performing correlated double sampling for each of the pixels by using the obtained D-phase output and P-phase output, a noise signal is detected, thereby making it possible to remove fixed-pattern noise due to the amplifier transistor Tr1.

Thereafter, by repeating the above-mentioned process, driving by global exposure is performed. In this way, by using the mechanical shutter, and performing the open/close operation of the mechanical shutter before the D-phase output, the simultaneity of storage of signal charge can be realized, thereby allowing all the pixels 2 to acquire the image at the same point in time.

While this embodiment is directed to the case in which an organic material is used as the material of the photoelectric conversion film 19, an inorganic material may be used as well. Examples of such an organic material include monocrystalline silicon, amorphous silicon, and chalcopyrite-based compounds such as CIGS. In this case, light is spectrally separated by providing a color filter layer that passes a desired wavelength of light on the illuminated side of the photoelectric conversion element 21.

While this embodiment is directed to the case in which the second electrode 20 is formed so as to be common to all of the pixels 20, it is possible for the second electrode 20 to be formed for each individual pixel, formed for each individual row of the pixels 2, or shared among a plurality of pixels. Next, a description will be given of Modification 1 and Modification 2 in which the second electrode 20 is modified in structure.

[Modification 1]

Figure 7:
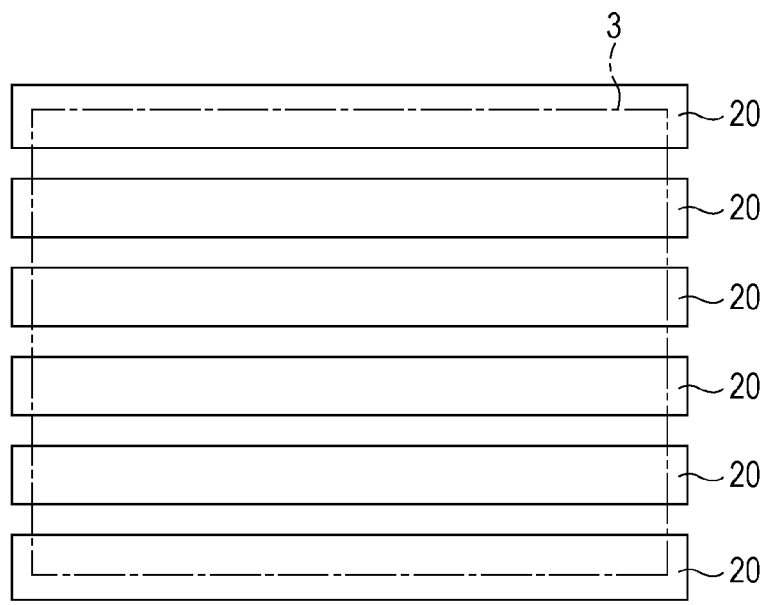
FIG. 7 is a plan diagram of the second electrode with respect to the imaging region according to Modification 1.

FIG. 7 is a plan diagram of the second electrode 20 with respect to the imaging region according to Modification 1.

Modification 1 differs from the first embodiment only in the structure of the second electrode 20.

In Modification 1, as shown in FIG. 7, the second electrode 20 is formed for each individual row of the pixels 2. The second electrode 20 mentioned above is formed by forming an electrode material on the photoelectric conversion film 19, and then patterning the electrode material.

In the structure according to Modification 1, the voltage control circuit 22 is connected to each of the second electrodes 20 formed for each individual row, thus enabling control for each individual row. Since Modification 1 allows the second electrodes 20 to be controlled separately for each individual row, there is such an advantage that sensitivity can be adjusted for each individual row.

[Modification 2]

Figure 8:
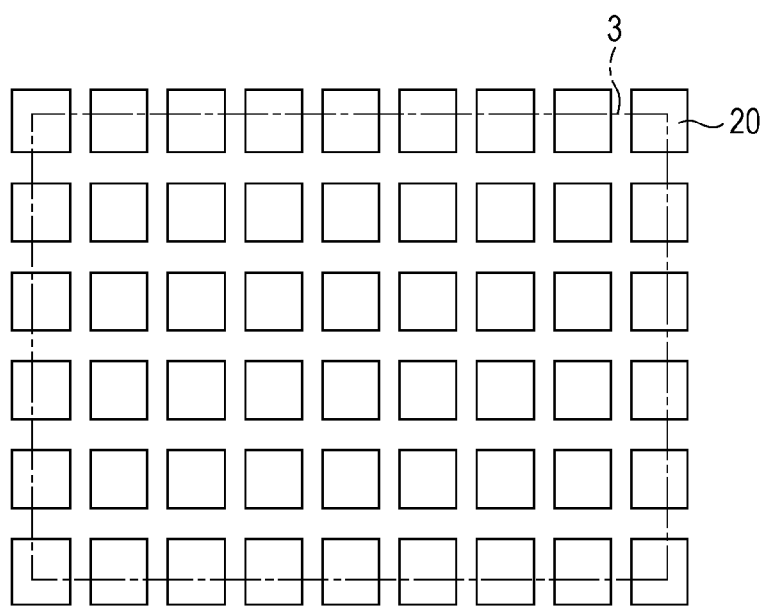
FIG. 8 is a plan diagram of the second electrode with respect to the imaging region according to Modification 2.

FIG. 8 is a plan diagram of the second electrode 20 with respect to the imaging region 3 according to Modification 2. Modification 2 differs from the first embodiment only in the structure of the second electrode 20.

In Modification 2, as shown in FIG. 8, the second electrode 20 is formed for each of the individual pixels 2. The second electrode 20 mentioned above is formed by forming an electrode material on the photoelectric conversion film 19, and then patterning the electrode material.

In Modification 2, the voltage control circuit 22 is connected to each of the second electrodes 20 formed for each of the individual pixels 2, thus enabling control for each of the individual pixels 2. Since Modification 2 allows the second electrodes 20 to be controlled separately for each of the individual pixels 2, there is such an advantage that sensitivity can be adjusted for each of the individual pixels 2.

<3. Second Embodiment: Front-illuminated Solid-state Imaging Device>

Figure 9:
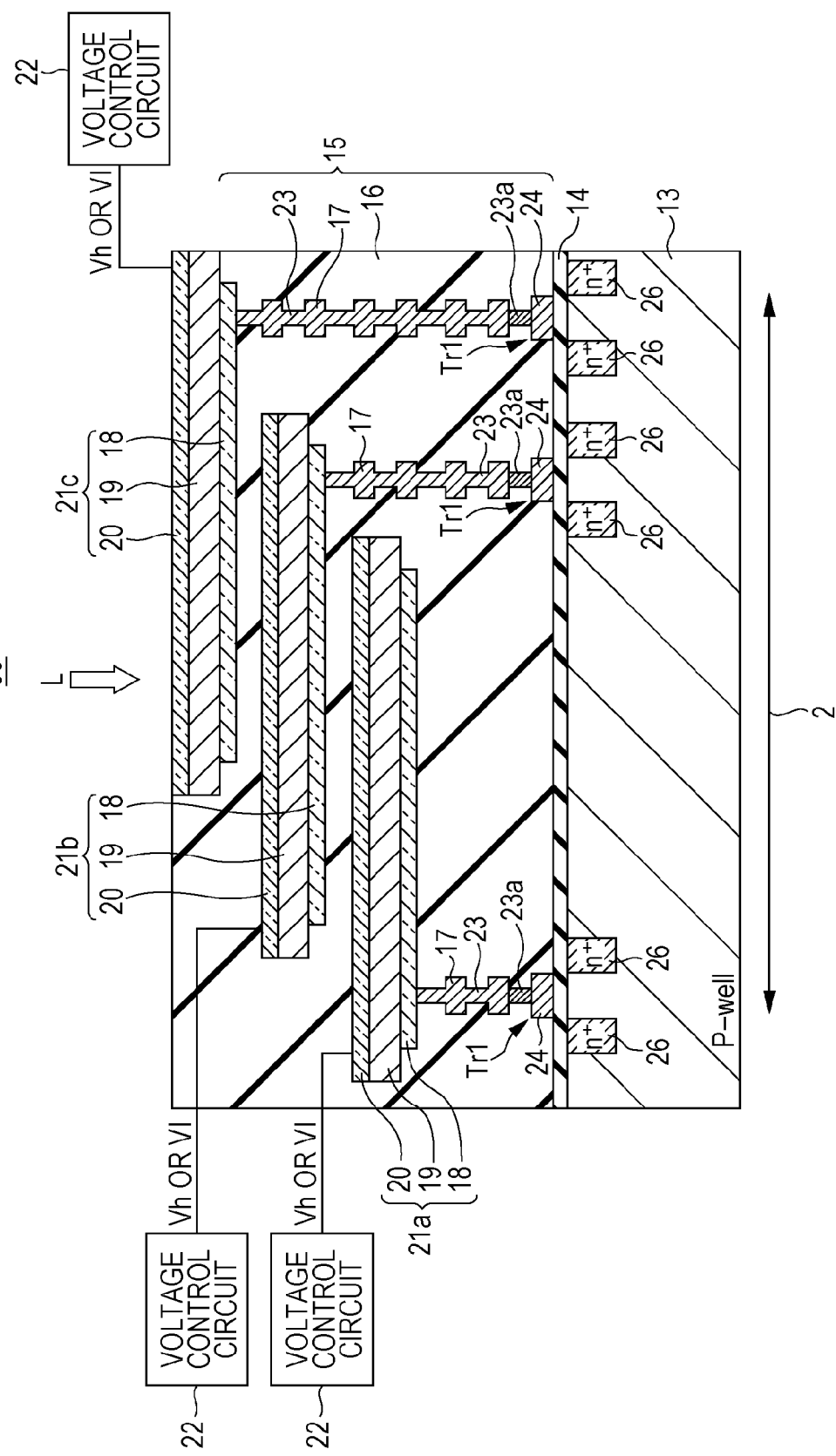
FIG. 9 is a schematic cross-sectional diagram of one pixel of a solid-state imaging device according to a second embodiment of the present invention.

Next, a solid-state imaging device according to a second embodiment of the present invention will be described. FIG. 9 is a schematic cross-sectional diagram of one pixel of a solid-state imaging device 50 according to this embodiment. In FIG. 9, portions corresponding to those in FIG. 2 are denoted by the same symbols, and repeated description is omitted. Also, since the overall structure of the solid-state imaging device 50 according to this embodiment is the same as that shown in FIG. 1, repeated description is omitted.

In this embodiment, three photoelectric conversion elements 21a, 21b, and 21c are laminated in three layers on top of the wiring layer 15. Each of the photoelectric conversion elements 21a, 21b, and 21c includes, for example, the photoelectric conversion film 19 made of an organic material, and the first electrode 18 and the second electrode 20 which are provided so as to sandwich the photoelectric conversion film 19. The photoelectric conversion elements 21a, 21b, and 21c as described above are laminated in three layers on the light incidence side via the interlayer insulating film 16.

The first electrode 18 of each of the photoelectric conversion elements 21a, 21b, and 21c is connected to the amplifier gate electrode 24 constituting each of the corresponding amplifier transistors Tr1, via the wire 17 and the contact 23. Further, the second electrode 20 of each of the photoelectric conversion elements 21a, 21b, and 21c is connected to each of the corresponding voltage control circuits 22. Also, although not shown, as in the first embodiment, a select transistor is provided at the subsequent stage of each of the corresponding amplifier transistors Tr1.

The respective photoelectric conversion films 19 constituting the three layers of photoelectric conversion elements 21a, 21b, and 21c are made of organic materials that absorb different wavebands of light, for example, red, blue, and green. Accordingly, when light L is incident from the incident side, the light having passed through the photoelectric conversion film 19 in the upper layer is absorbed by the photoelectric conversion film 19 in the lower layer. As a result, in each of the photoelectric conversion elements 21a, 21b, and 21c, signal charge according to the quantity of each wavelength of light is generated and stored.

As shown in FIG. 9, the solid-state imaging device 50 according to this embodiment is illuminated with the light L from the front side of the substrate 13. Further, in this embodiment, by laminating the photoelectric conversion elements 21 made of the photoelectric conversion films 19 that absorb different wavebands of light, light can be spectrally separated along the vertical direction within a single pixel.

In this embodiment as well, the same driving method as that in the first embodiment can be used. Further, in this embodiment as well, the same effect as that of the first embodiment can be obtained.

<4. Third Embodiment: Front-illuminated Solid-state Imaging Device>

Figure 10:
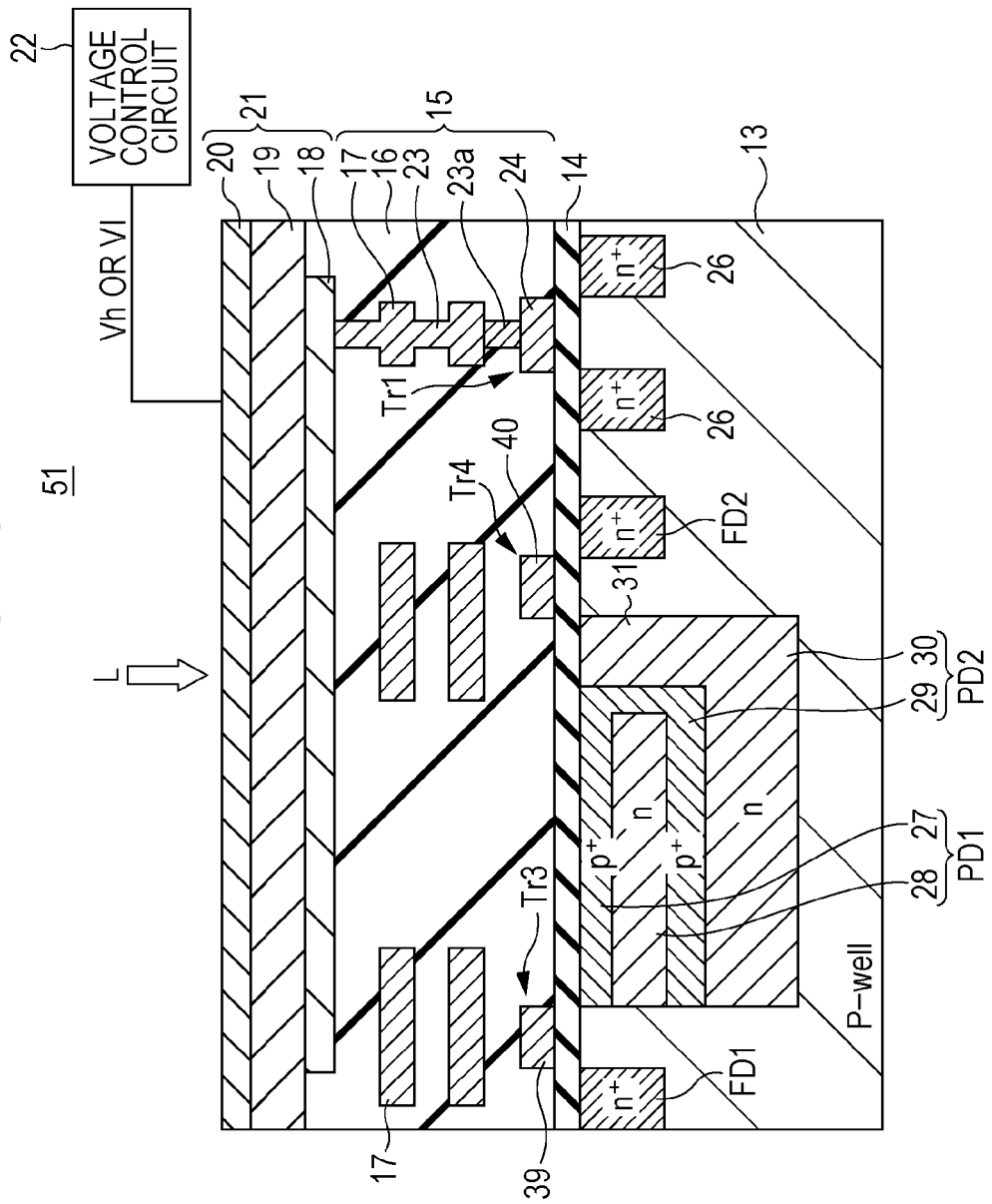
FIG. 10 is a schematic cross-sectional diagram of one pixel of a solid-state imaging device according to a third embodiment of the present invention.

Next, a solid-state imaging device according to a third embodiment of the present invention will be described. FIG. 10 is a schematic cross-sectional diagram of one pixel of a solid-state imaging device 51 according to this embodiment. In FIG. 10, portions corresponding to those in FIG. 2 are denoted by the same symbols, and repeated description is omitted. Also, since the overall structure of the solid-state imaging device 51 according to this embodiment is the same as that shown in FIG. 1, repeated description is omitted.

In this embodiment, the photoelectric conversion element 21 made of the photoelectric conversion film 19, and photoelectric conversion elements made of photodiodes formed within the substrate 13 are laminated along the incidence direction of light. As shown in FIG. 10, on top of the wiring layer 15, for example, the photoelectric conversion element 21 made of the photoelectric conversion film 19 that absorbs the green wavelength of light is formed, and along the depth direction within the substrate 13, a first photodiode PD1 and a second photodiode PD2 are formed.

The first photodiode PD1 includes a p-type high concentration impurity region ($p^+$ region) 27, and an n-type impurity region (n-region) 28 that are formed in order along the depth direction from the surface of the substrate 13. The first photodiode PD1 is formed mainly by a pn junction that is the junction interface between the $p^+$ region 27 and the n-region 28. The $p^+$ region 27 formed in the surface of the substrate 13 serves as a dark current suppression region for suppressing dark current produced at the interface of the substrate 13.

The second photodiode PD2 is formed in a deeper region of the substrate 13 than the first photodiode PD1. The second photodiode PD2 includes a $p^+$ region 29 and an n-region 30 which are formed in order in layers below the n-region 28. The second photodiode PD2 is formed mainly by a pn junction that is the junction interface between the $p^+$ region 29 and the n-region 30. A part of the n-region 30 constituting the second photodiode PD2 is formed as a charge transfer path 31 so as to extend continuously to the front side of the substrate 13.

In the substrate 13 made of silicon, the wavelength of light absorbed varies with the incident depth of light. Thus, light can be spectrally separated along the vertical direction within the substrate 13. In this embodiment, the pn junction forming the first photodiode PD1 is provided at the substrate depth for performing photoelectric conversion of blue light, and the pn junction forming the second photodiode PD2 is provided at the substrate depth for performing photoelectric conversion of red light. Thus, in the first photodiode PD1, signal charge according to blue light is generated, and stored in the n-region 28. Also, in the second photodiode PD2, signal charge according to red light is generated, and stored in the n-region 30.

In a region adjacent to the first photodiode PD1, a first transfer transistor Tr3 whose drain is a floating diffusion FD1 is formed. The first transfer transistor Tr3 includes the floating diffusion FD1, and a transfer gate electrode 39. The floating diffusion FD1 is formed by an n-type high concentration impurity region formed in the near-surface side of the substrate 13. The transfer gate electrode 39 is formed on top of the substrate 13 between the floating diffusion FD1 and the first photodiode PD1 via the gate insulating film 14.

In a region adjacent to the charge transfer path 31 of the second photodiode PD2, a second transfer transistor Tr4 whose drain is a floating diffusion FD2 is formed. The second transfer transistor Tr4 includes the floating diffusion FD2, and a transfer gate electrode 40. The floating diffusion FD2 is formed by an n-type high concentration impurity region formed in the near-surface side of the substrate 13. The transfer gate electrode 40 is formed on top of the substrate 13 between the floating diffusion FD2 and the charge transfer path 31 via the gate insulating film 14.

In addition, although not shown, pixel transistors such as a reset transistor and a select transistor are formed in the subsequent stage of each of the first transfer transistor Tr3 and the second transfer transistor Tr4.

As shown in FIG. 10, the solid-state imaging device 51 according to this embodiment is illuminated with light L from the front side of the substrate 13. Of the light L incident on each of the pixels 2, green light is absorbed by the photoelectric conversion film 19, and the other colors of light pass through the photoelectric conversion film 19 to be incident on the substrate 13. Of the light incident on the substrate 13, blue light is absorbed by the first photodiode PD1 formed in the near-surface side of the substrate 13, red light is absorbed by the second photodiode PD2 formed in the deeper side of the substrate 13. Signal charge due to green light is generated and stored in the photoelectric conversion film 19, signal charge due to blue light is generated and stored in the first photodiode PD1, and signal charge due to red light is generated and stored in the second photodiode PD2.

The signal charge generated and stored in the photoelectric conversion film 19 is outputted as a pixel signal in the same manner as in the first embodiment. After the pixel signal is outputted, the photoelectric conversion film is reset in the same manner as in the first embodiment.

The signal charges generated and stored in the first photodiode PD1 and the second photodiode PD2 are respectively read out by the first transfer transistor Tr3 and the second transfer transistor Tr4 to their respective floating diffusions FD1 and FD2. Then, the signal charge read out to each of the floating diffusions FD1 and FD2 is amplified by an amplifier transistor (not shown), and selectively outputted to the signal wire by a select transistor. The potential of each of the floating diffusions FD1 and FD2 is reset by a reset transistor (not shown).

In the solid-state imaging device 51 according to this embodiment, pixel signals based on three color wavelengths of light can be obtained within a single pixel by the photoelectric conversion element 21 made of the photoelectric conversion film 19, and the first photodiode PD1 and the second photodiode PD2 that are formed in the substrate 13.

In this embodiment, the photoelectric conversion film 19 formed in the side closest to the light incidence side is made of an organic material that absorbs the green wavelength of light, and the other wavelengths of light are absorbed within the substrate. However, this should not be construed restrictively, and various alterations are possible. When the photoelectric conversion film 19 is made of an organic material that absorbs the green wavelength of light, and blue light and red light located in distant wavelength ranges from each other are spectrally separated vertically within the substrate 13 as in this embodiment, the accuracy of spectral separation within the substrate 13 can be enhanced.

While this embodiment is directed to the case in which two layers of photodiodes are formed within the substrate 13, the number of layers of photodiodes formed within the substrate 13 may be any number more than one. For example, in the case where only one photodiode is formed within the substrate 13, by mounting a color filter that passes a specific wavelength of light on top of the photoelectric conversion film 19, the accuracy of spectral separation can be increased. In the case where a color filter is mounted on top of the photoelectric conversion film 19, the color filter used is, for example, a color filter that transmits two colors of light. Also, the color filter may be provided between the photoelectric conversion film 19 and the substrate 13.

In this embodiment as well, by forming the second electrode 20 so as to be common to all of pixels, the number of transistors used for resetting can be reduced, thus enabling a reduction in pixel size. In addition, it is also possible to secure a large area for the photodiodes formed within the substrate 13, thereby allowing an improvement in aperture ratio.

In this embodiment as well, the same effect as that of the first embodiment can be obtained.

<5. Fourth Embodiment: Back-illuminated Solid-state Imaging Device>

Figure 11:
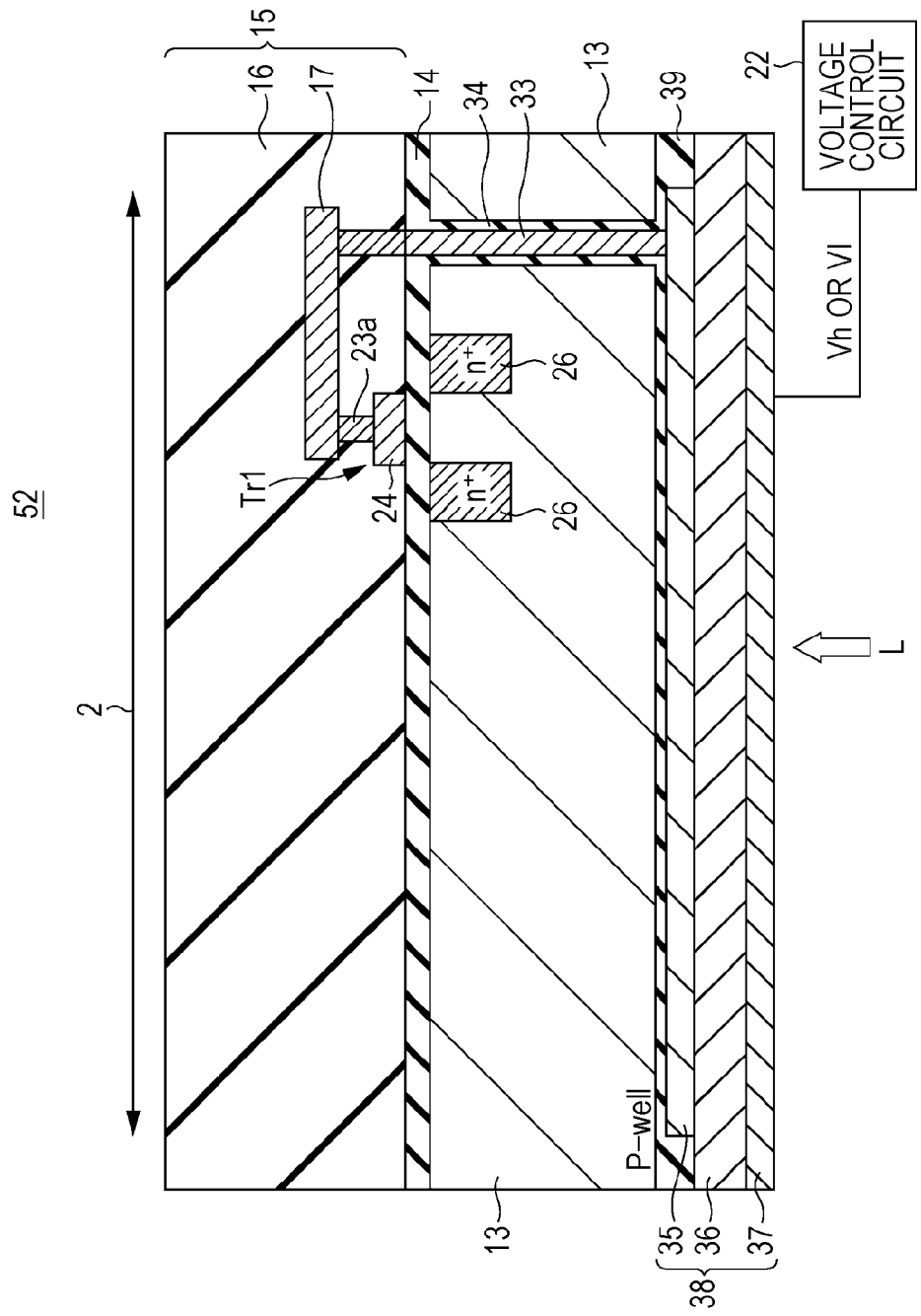
FIG. 11 is a schematic cross-sectional diagram of one pixel of a solid-state imaging device according to a fourth embodiment of the present invention.

Next, a solid-state imaging device according to a fourth embodiment of the present invention will be described. FIG. 11 is a schematic cross-sectional diagram of one pixel of a solid-state imaging device 52 according to this embodiment. In FIG. 11, portions corresponding to those in FIG. 2 are denoted by the same symbols, and repeated description is omitted. Also, since the overall structure of the solid-state imaging device 52 according to this embodiment is the same as that shown in FIG. 1, repeated description is omitted.

In this embodiment, a photoelectric conversion element 38 including a photoelectric conversion film 36, and a first electrode 35 and a second electrode 37 that sandwich the photoelectric conversion film 36 is provided on the back side of the substrate 13. As shown in FIG. 11, the first electrode 35 is formed on the back side of the substrate 13 via an insulating film 39. The first electrode 35 is connected to the contact 23a and the wire 17 in the wiring layer 15 formed on the surface of the substrate 13, via a through electrode 33 formed so as to extend through the substrate 13 from the back side to the front side, and is connected to the amplifier gate electrode 24 of the amplifier transistor Tr1.

The through electrode 33 can be formed by forming a through hole so as to extend through the substrate 13 from the front side of the substrate 13, and after covering the side wall of the through hole with an insulating film 34, filling a metallic material, polysilicon, amorphous silicon containing impurities, or the like in the thorough hole. Also, the through electrode 33 may be formed using a wire formed by ion implantation by ion-implanting n-type or p-type impurities. In that case, it is necessary to cover the side wall of the through electrode with an impurity region of a conductivity type opposite to that of the through electrode formed by the ion implantation.

To form the solid-state imaging device 52 according to this embodiment, the amplifier transistor Tr1 and the like are formed on the front side of the substrate 13, and after the through electrode 33 is formed, the wiring layer 15 is formed so that the through electrode 33 and the amplifier gate electrode 24 are electrically connected to each other. Thereafter, the substrate 13 is turned upside down, and the first electrode 35, the photoelectric conversion film 36, and the second electrode 37 are laminated on the back side of the substrate 13 via the insulating film 39, thereby forming the solid-state imaging device 52. While the second electrode 37 is connected to the voltage control circuit 22 in this embodiment as well, the voltage control circuit 22 may be formed either on the front side of the substrate 13 or on the back side of the substrate 13. In the case where the voltage control circuit 22 is formed on the front side of the substrate 13, the connection between the second electrode 37 and the voltage control circuit 22 is also made by the through electrode 33 that extends through the substrate 13.

In this embodiment as well, a flattening film, an on-chip micro lens, and the like (not shown) are formed on top of the second electrode 37 on the light incidence side. As shown in FIG. 11, the solid-state imaging device 52 according to this embodiment is illuminated with light L from the back side of the substrate 13. The light L made incident from the back side of the substrate 13 undergoes photoelectric conversion by the photoelectric conversion film 36, and is stored on the first electrode 35 side by the same driving method as that in the first embodiment. Then, fluctuation of the potential of the first electrode 35 during charge storage is transmitted to the amplifier gate electrode 24 formed on the front side of the substrate 13, via the through electrode 33. Then, in this embodiment as well, the quantity of the signal charge photoelectrically converted by the photoelectric conversion film 36 is detected by the potential fluctuation of the amplifier electrode 24, and a pixel signal is transferred to the signal wire by a select transistor (not shown).

In the solid-state imaging device 52 according to this embodiment as well, at the time of reset, the reset is done by signal charge being discharged to the second electrode 37 side.

In this way, in this embodiment, a back-illuminated solid-state imaging device using the photoelectric conversion film 36 can be formed by connecting the first electrode 35 formed on the back side of the substrate 13 to the amplifier gate electrode 24 formed on the front side of the substrate 13 via the through electrode 33. With the solid-state imaging device 52 according to this embodiment as well, the same effect as that of the first embodiment can be obtained.

<6. Fifth Embodiment: Back-illuminated Solid-state Imaging Device>

Figure 12:
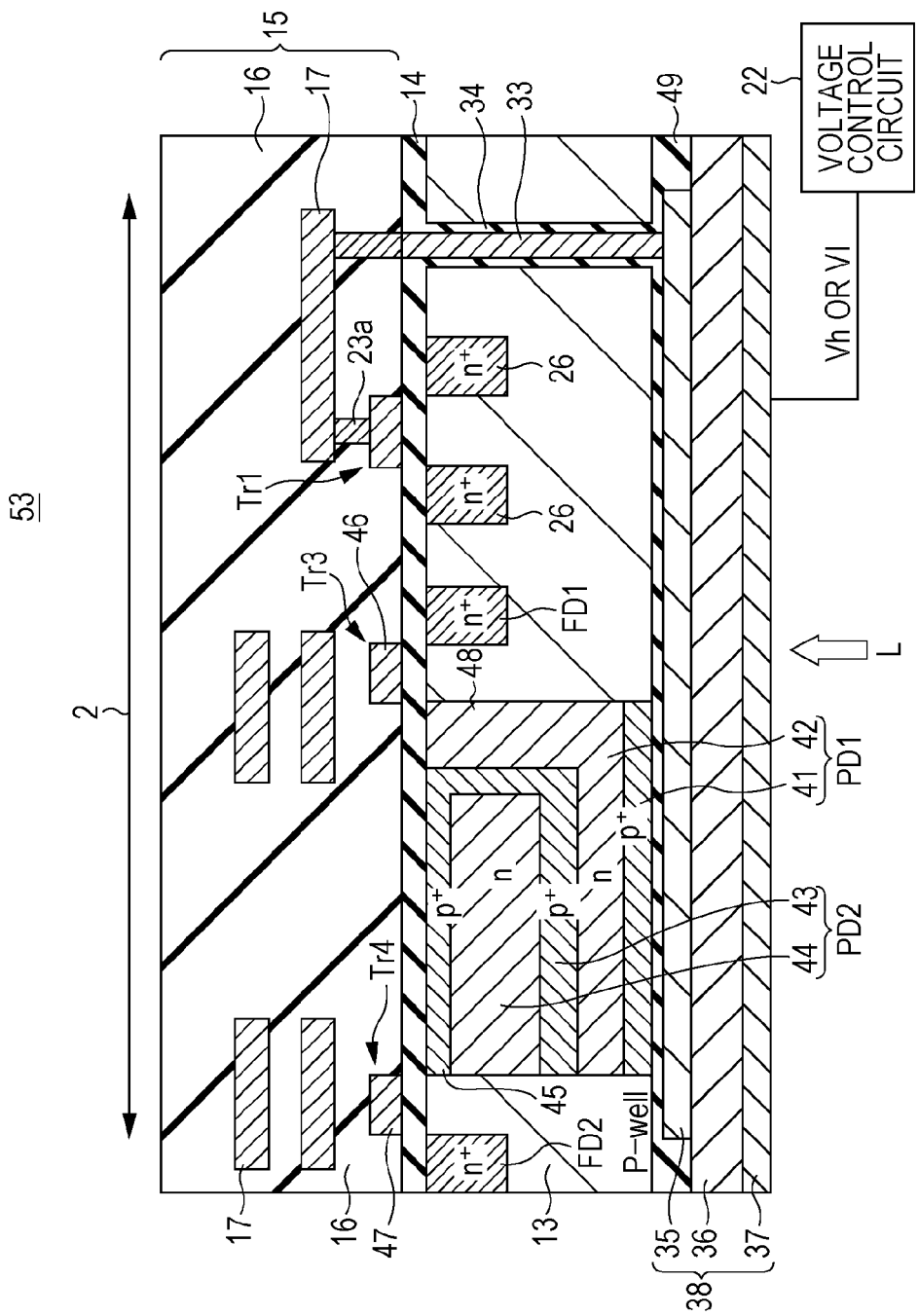
FIG. 12 is a schematic cross-sectional diagram of one pixel of a solid-state imaging device according to a fifth embodiment of the present invention.

Next, a solid-state imaging device according to a fifth embodiment of the present invention will be described. FIG. 12 is a schematic cross-sectional diagram of one pixel of a solid-state imaging device 53 according to this embodiment. In FIG. 12, portions corresponding to those in FIGS. 2 and 11 are denoted by the same symbols, and repeated description is omitted. Also, since the overall structure of the solid-state imaging device 53 according to this embodiment is the same as that shown in FIG. 1, repeated description is omitted.

In the solid-state imaging device 53 according to this embodiment, the photoelectric conversion element 38 made of the photoelectric conversion film 36 is provided on the back side of the substrate 13, and the photoelectric conversion element 38 made of the photoelectric conversion film 36, and photoelectric conversion elements made of photodiodes formed within the substrate 13 are laminated along the incidence direction of light.

As shown in FIG. 12, on the back side of the substrate 13, for example, the photoelectric conversion element 38 made of the photoelectric conversion film 36 that absorbs the green wavelength of light is formed, and from the back side toward the front side within the substrate 13, the first photodiode PD1 and the second photodiode PD2 are formed.

The first photodiode PD1 includes a p-type high concentration impurity region ($p^+$ region) 41, and an n-type impurity region (n-region) 42 formed in order from the back toward the front side of the substrate 13. The first photodiode PD1 is formed mainly by a pn junction that is the junction interface between the $p^+$ region 41 and the n-region 42. The $p^+$ region 41 formed on the back of the substrate 13 serves as a dark current suppression region for suppressing dark current produced at the interface of the substrate 13. A part of the n-region 42 constituting the first photodiode PD1 is formed as a charge transfer path 48 so as to extend continuously to the front side of the substrate 13.

The second photodiode PD2 is formed in a region closer to the front side of the substrate 13 than the first photodiode PD1. The second photodiode PD2 includes a $p^+$ region 43 and an n-region 44 which are formed in order on the side closer to the front side than the n-region 42. The second photodiode PD2 is formed mainly by a pn junction that is the junction interface between the $p^+$ region 43 and the n-region 44. Also, a dark current suppression region formed by a p-type high concentration impurity region ($p^+$ region) 45 is formed at the interface between the substrate 13 and the wiring layer 15 in the surface of the substrate 13.

As shown in FIG. 12, the solid-state imaging device 53 according to this embodiment is illuminated with light L from the back side of the substrate 13. Therefore, blue light undergoes photoelectric conversion in the first photodiode PD1 formed on the back side of the substrate 13, and red light undergoes photoelectric conversion in the second photodiode PD2 formed on the front side of the substrate 13.

On the front side of the substrate 13 adjacent to the charge transfer path 48 of the first photodiode PD1, the first transfer transistor Tr3 whose drain is the floating diffusion FD1 is formed. The first transfer transistor Tr3 includes the floating diffusion FD1, and a transfer gate electrode 46. The floating diffusion FD1 is formed by an n-type high concentration impurity region formed in the near-surface side of the substrate 13. The transfer gate electrode 46 is formed on top of the substrate 13 between the floating diffusion FD1 and the charge transfer path 48 via the gate insulating film 14.

On the front side of the substrate 13 adjacent to the second photodiode PD2, the second transfer transistor Tr4 whose drain is the floating diffusion FD2 is formed. The second transfer transistor Tr4 includes the floating diffusion FD2, and a transfer gate electrode 47. The floating diffusion FD2 is formed by an n-type high concentration impurity region formed in the near-surface side of the substrate 13. The transfer gate electrode 47 is formed on top of the substrate 13 between the floating diffusion FD2 and the second photodiode PD2 via the gate insulating film 14.

In addition, although not shown, pixel transistors such as a reset transistor and a select transistor are formed in the subsequent stage of each of the first transfer transistor Tr3 and the second transfer transistor Tr4.

In the solid-state imaging device according to this embodiment, of the light L incident on each of the pixels 2, green light is absorbed by the photoelectric conversion film, and the other colors of light pass through the photoelectric conversion film 36 to be incident on the substrate 13. Of the light incident on the substrate 13, blue color is absorbed by the first photodiode PD1 formed in the near-surface side of the substrate 13, and red light is absorbed by the second photodiode PD2 formed in the deeper side of the substrate. Signal charge due to green light is generated and stored in the photoelectric conversion film 36, signal charge due to blue light is generated and stored in the first photodiode PD1, and signal charge due to red light is generated and stored in the second photodiode PD2.

The signal charge generated and stored in the photoelectric conversion film 36 is outputted as a pixel signal in the same manner as in the first embodiment. After the pixel signal is outputted, the photoelectric conversion film is reset in the same manner as in the first embodiment.

The signal charges generated and stored in the first photodiode PD1 and the second photodiode PD2 are respectively read out by the first transfer transistor Tr3 and the second transfer transistor Tr4 to their respective floating diffusions FD1 and FD2. Then, the signal charge read out to each of the floating diffusions FD1 and FD2 is amplified by an amplifier transistor (not shown), and selectively outputted to the signal wire by a select transistor. The potential of each of the floating diffusions FD1 and FD2 is reset by a reset transistor (not shown).

In the solid-state imaging device 53 according to this embodiment, pixel signals based on three color wavelengths of light can be obtained within a single pixel by the photoelectric conversion element 38 made of the photoelectric conversion film 36, and the first photodiode PD1 and the second photodiode PD2 that are formed in the substrate 13.

The driving method during signal charge and at reset is the same as in the first embodiment, and the same effect as that of the first embodiment can be obtained.

As described above, according to an embodiment of the present invention, in the solid-state imaging device having the photoelectric conversion element formed by sandwiching the photoelectric conversion film by the first electrode and the second electrode, the electrode (first electrode) on the side where signal charge is read out is connected to only the gate electrode of the amplifier transistor. Furthermore, the signal charge is reset from the second electrode side. Therefore, it is unnecessary to connect the first electrode on the side where the signal charge is read out, to a high concentration semiconductor region in the substrate, and hence it is unnecessary to provide a high concentration semiconductor region that becomes the cause of dark current. Thus, dark current can be suppressed, thereby making it possible to suppress noise.

The first to fifth embodiments described above are directed to the case of applying the present invention to a CMOS type solid-state imaging device in which unit pixels that detect signal charge according to the quantity of incident light as a physical quantity are arranged in matrix form. However, the present invention is not limited in its application to such a CMOS type solid-state imaging device. Also, the present invention is not limited to the general range of column type solid-state imaging devices having a column circuit arranged for each individual column of pixels in a pixel section where pixels are formed in a two-dimensional matrix fashion.

Also, the present invention is not limited in its application to a solid-state imaging device that detects the distribution of the quantity of incident visible light to capture an image. The present invention is also applicable to a solid-state imaging device that captures the distribution of the quantity of incident infrared or X-rays, particles, or the like as an image. Also, in a broad sense, the present invention is applicable to the general range of solid-state imaging devices (physical-quantity-distribution detecting devices), such as a fingerprint detection sensor, which detect the distribution of another physical quantity such as pressure or capacitance.

Furthermore, the present invention is not limited to a solid-state imaging device that sequentially scans unit pixels in the imaging region on a row-by-row basis to read out a pixel signal from each individual unit pixel. The present invention is also applicable to an X-Y addressable solid-state imaging device that selects an arbitrary pixel on a pixel-by-pixel basis, and reads out a signal from this selected pixel on a pixel-by-pixel basis.

It should be noted that the solid-state imaging device may be formed either as a single chip or as a module having an imaging function in which a pixel section, and a signal processing section or an optical system are packaged together.

The embodiment of the present invention is not limited to each of the first to fifth embodiments described above but various alterations are possible. Also, while the above-described examples are mainly directed to the case where n-channel MOS transistors are formed, it is also possible to form p-channel MOS transistors. In the case of forming p-channel MOS transistors, the conductivity type is reversed in the drawings.

Also, the present invention is not limited in its application to a solid-state imaging device, but is also applicable to an imaging device. Here, the term imaging device refers to a camera system such as a digital still camera or a video camera, or an electronic apparatus having an imaging function such as a mobile phone. It should be noted that in some cases, the term imaging device also refers to an imaging device in the form of the module mentioned above mounted in an electronic apparatus, that is, a camera module.

<7. Sixth Embodiment: Electronic Apparatus>

Figure 13:
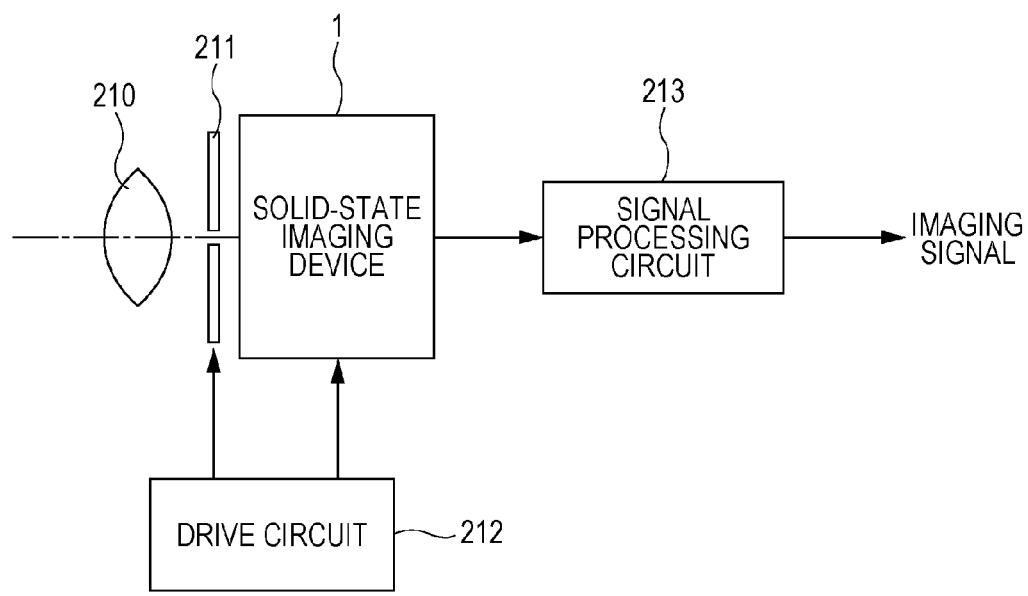
FIG. 13 is a schematic diagram of an electronic apparatus according to a sixth embodiment of the present invention.
Figure 14:
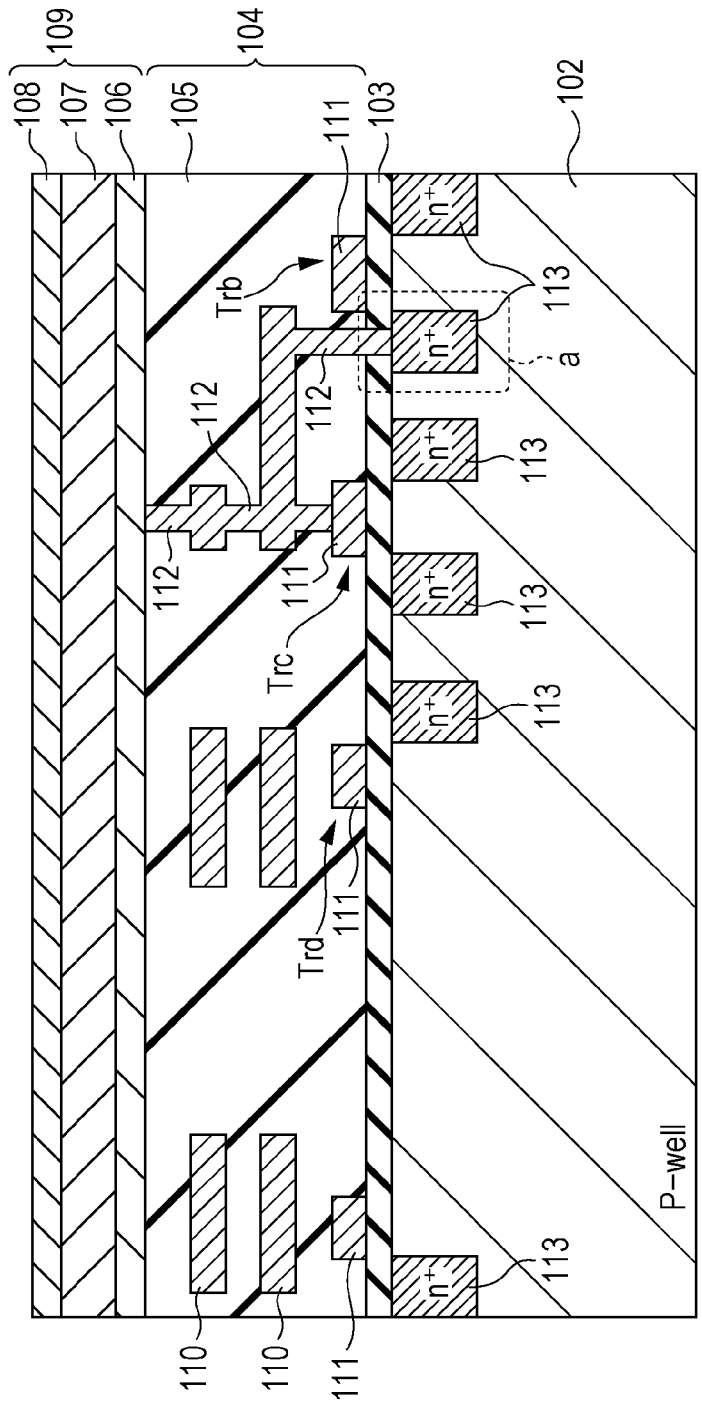
FIG. 14 is a schematic cross-sectional diagram of a solid-state imaging device according to the related art.
Figure 15:
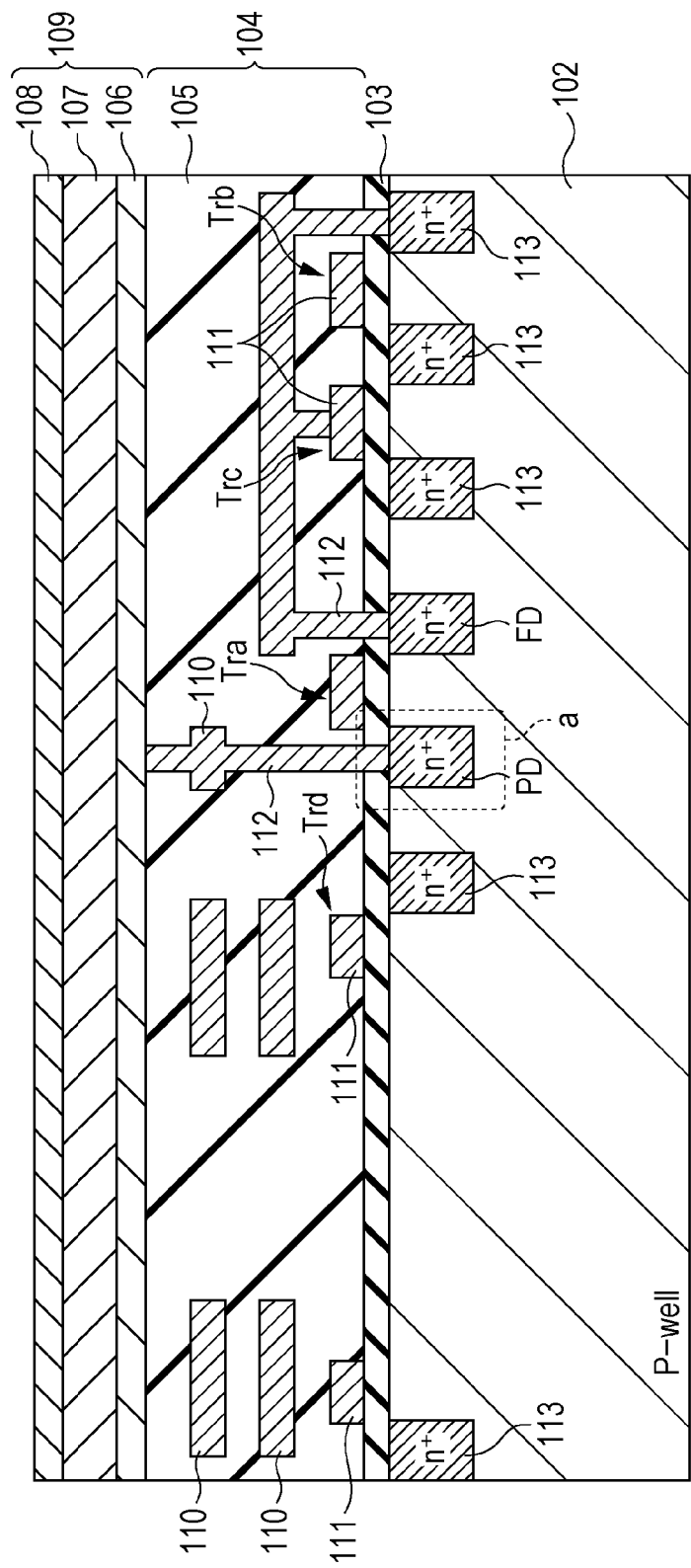
FIG. 15 is a schematic cross-sectional diagram of a solid-state imaging device according to the related art.

Next, an electronic apparatus according to a sixth embodiment of the present invention will be described. FIG. 13 is a schematic diagram of an electronic apparatus 200 according to the sixth embodiment of the present invention.

The electronic apparatus 200 according to this embodiment represents the case in which the solid-state imaging device 1 according to the first embodiment of the present invention described above is used in an electronic apparatus (camera).

The electronic apparatus 200 according to this embodiment has the solid-state imaging device 1, an optical lens 210, a shutter device 211, a drive circuit 212, and a signal processing circuit 213.

The optical lens 210 forms an image of image light (incident light) from a subject on the imaging surface of the solid-state imaging device 1. Thus, the resulting signal charge is stored in the solid-state imaging device 1 for a predetermined period of time.

The shutter device 211 controls the radiation period and blocking period of light to the solid-state imaging device 1.

The drive circuit 212 supplies a drive signal for controlling the transfer operation of the solid-state imaging device 1 and the shutter operation of the shutter device 211. Signal transfer for the solid-state imaging device 1 is performed by the drive signal (timing signal) supplied from the drive circuit 212. The signal processing circuit 213 performs various kinds of signal processing. A picture signal on which signal processing has been performed is stored in a storage medium such as a memory, or outputted to a monitor.

In the electronic apparatus 200 according to this embodiment, noise due to dark current in the solid-state imaging device 1 is prevented, thereby improving image quality.

The electronic apparatus 200 to which the solid-state imaging device 1 can be applied is not limited to a camera, but the solid-state imaging device 1 is also applicable to a digital still camera or, further, an imaging device such as a camera module for mobile apparatus such as a mobile phone.

While in this embodiment the solid-state imaging device 1 is used in an electronic apparatus, it is also possible to use the solid-state imaging device fabricated in accordance with the second embodiment mentioned above.

According to an embodiment of the present invention, in a solid-state imaging device including, on top of a substrate, a photoelectric conversion element formed by sandwiching a photoelectric conversion film made of an organic material or an inorganic material by a pair of electrodes, dark current during charge storage is suppressed, and improved pixel characteristics are attained.

The present application contains subject matter related to that disclosed in Japanese Priority Patent Application JP 2010-049233 filed in the Japan Patent Office on Mar. 5, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
   a substrate;
   a photoelectric conversion element provided on a light incident side of the substrate and including a photoelectric conversion film sandwiched between a first electrode and a second electrode, the photoelectric conversion film generating a signal charge according to a quantity of incident light;
   an amplifier transistor having an amplifier gate electrode electrically connected to the first electrode; and
   a voltage control circuit electrically connected to the second electrode, and configured to selectively apply (i) a first voltage to the second electrode during a charge storage operation and (ii) a second voltage to the second electrode during a reset operation, the second voltage having a different voltage value from that of the first voltage.

2. The solid-state imaging device according to claim 1, wherein the voltage control circuit supplies, during a charge storage operation, the first voltage having a voltage value effective to move the signal charge generated by the photoelectric conversion film toward the first electrode, and supplies, at a reset operation, the second voltage having a voltage value effective to move the signal charge toward the second electrode.

3. The solid-state imaging device according to claim 2, wherein the second electrode is formed as a separate electrode for each pixel.

4. The solid-state imaging device according to claim 2, wherein the second electrode is common to a plurality of pixels.

5. The solid-state imaging device according to claim 2, wherein pixels are arranged in a two-dimensional matrix, and the second electrode includes a separate electrode that is common to each row of pixels.

6. The solid-state imaging device according to claim 1, wherein the photoelectric conversion element comprises a plurality of layers on the light incident side of the substrate.

7. The solid-state imaging device according to claim 1, further comprising at least one photodiode provided within the substrate, the photodiode generating a signal charge according to a quantity of incident light.

8. The solid-state imaging device according to claim 1, wherein the photoelectric conversion element is formed on a front side of the substrate, and a connection between the first electrode and the amplifier gate electrode is made by a wiring layer provided between the photoelectric conversion element and the substrate.

9. The solid-state imaging device according to claim 1, wherein the photoelectric conversion element is formed on a back side of the substrate, and a connection between the first electrode and the amplifier gate electrode is made by a through electrode that extends through the substrate, and a wiring layer formed on the front side of the substrate.

10. The solid-state imaging device of claim 1, wherein the first voltage is a voltage value that is less than that of the second voltage.

11. A method of fabricating a solid-state imaging device, comprising the steps of:
   forming a plurality of transistors with respect to a substrate;
   forming a wiring layer on the substrate, the wiring layer comprising an interlayer insulating film and a plurality of wires;
   forming a first electrode on an illuminated side of the substrates;
   electrically connecting an amplifier gate electrode of an amplifier transistor of the plurality of transistors to the first electrode;
   forming a photoelectric conversion film over the first electrode; and
   forming a second electrode over the photoelectric conversion film; and
   electrically connecting a voltage control circuit to the second electrode,
   wherein,
      the voltage control circuit is configured to selectively apply (i) a first voltage to the second electrode during a charge storage operation and (ii) a second voltage to the second electrode during a reset operation, the second voltage having a different voltage value from that of the first voltage.

12. A method of driving a solid-state imaging device having
   a substrate,
   a photoelectric conversion element provided on a light incident side of the substrate and including a photoelectric conversion film sandwiched between a first electrode and a second electrode, the photoelectric conversion film generating a signal charge according to a quantity of incident light,
   an amplifier transistor having an amplifier gate electrode electrically connected to the first electrode, and a voltage control circuit connected to the second electrode, the method comprising:
   supplying a first voltage to the second electrode from the voltage control circuit during a charge storage operation, to move the signal charge generated by the photoelectric conversion film toward the first electrode, and output a pixel signal by detecting a potential of the first electrode by the amplifier transistor; and
   supplying a second voltage to the second electrode from the voltage control circuit during a reset operation, to discharge the signal charge stored on the first electrode, the second voltage being different from the first voltage.

13. The method of driving a solid-state imaging device according to claim 12, further comprising the steps of:
   reading out a reset signal, by detecting the potential of the first electrode by the amplifier transistor immediately after discharging the signal charge stored on the first electrode side by the reset operation; and
   detecting a noise signal by comparing the pixel signal with the reset signal.

14. The method of driving a solid-state imaging device according to claim 13, further comprising the step of:

starting exposure simultaneously for all of the pixels by opening a mechanical shutter, and finishing the exposure simultaneously for all of the pixels by closing the mechanical shutter, during the charge storage operation.

15. An electronic apparatus comprising:

an optical lens;

a solid-state imaging device on which light collected by the optical lens is made incident, the solid-state imaging device including (a) a substrate, (b) a photoelectric conversion element provided on a light incident side of the substrate and including a photoelectric conversion film sandwiched between a first electrode and a second electrode, the photoelectric conversion film generating a signal charge according to a quantity of incident light, (c) an amplifier transistor having an amplifier gate electrode connected to the first electrode, and (d) a voltage control circuit electrically connected to the second electrode, and configured to selectively apply (i) a first voltage to the second electrode during a charge storage operation and (ii) a second voltage to the second electrode during a reset operation, the second voltage having a different voltage value from that of the first voltage; and a signal processing circuit that processes an output signal outputted from the solid-state imaging device.

* * * * *